(12) United States Patent
Norman

(10) Patent No.: US 8,064,284 B2
(45) Date of Patent: Nov. 22, 2011

(54) METHOD FOR ACCESSING VERTICALLY STACKED EMBEDDED NON-FLASH RE-WRITABLE NON-VOLATILE MEMORY

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 0 days.

(21) Appl. No.: 12/931,972

(22) Filed: Feb. 15, 2011

(65) Prior Publication Data

US 2011/0134715 A1    Jun. 9, 2011

Related U.S. Application Data

(63) Continuation of application No. 12/925,062, filed on Oct. 12, 2010, now Pat. No. 7,889,591, which is a continuation of application No. 11/893,644, filed on Aug. 16, 2007, now Pat. No. 7,813,210.

(51) Int. Cl.
*G11C 8/00* (2006.01)
(52) U.S. Cl. .............................. 365/230.03; 365/230.06
(58) Field of Classification Search ............. 365/230.03, 365/230.06
See application file for complete search history.

(56) References Cited

U.S. PATENT DOCUMENTS

| 7,236,411 | B1 * | 6/2007 | Saini et al. | 365/194 |
| 7,813,210 | B2 * | 10/2010 | Norman | 365/230.03 |
| 7,889,591 | B1 * | 2/2011 | Norman | 365/230.03 |

* cited by examiner

*Primary Examiner* — Michael Tran

(57) ABSTRACT

A multiple-type memory is disclosed. The multiple-type memory includes memory blocks in communication with control logic blocks. The memory blocks and the control logic blocks are configured to emulate a plurality of memory types. The memory blocks can be configured into a plurality of memory planes that are vertically stacked upon one another. The vertically stacked memory planes may be used to increase data storage density and/or the number of memory types that can be emulated by the multiple-type memory. Each memory plane can emulate one or more memory types. The control logic blocks can be formed in a substrate (e.g., a silicon substrate including CMOS circuitry) and the memory blocks or the plurality of memory planes can be positioned over the substrate and in communication with the control logic blocks. The multiple-type memory may be non-volatile so that stored data is retained in the absence of power.

17 Claims, 17 Drawing Sheets

| Input addresses for Bank Selects (i.e., Sel-0, Sel-1, Sel-2, & Sel-3) |
|---|
| 0000 0000 → 0000 not used |
| 0000 0001 → 0000 not used |
| 0000 0010 → 0000 not used |
| 0000 0011 → 0000 not used |
| |
| Sel-0 is: |
| 0000 *1100* through 0000 *0100* |
| |
| Sel-1 is: |
| *0011 1111* through *0001 0000* |
| |
| Sel-2 is: |
| 0100 *1111* through 0100 *0010* |
| |
| Sel-3 is: |
| 1100 *1100* through 1100 *1000* |

FIG. 9C

| Memory Plane 992 |
|---|
| Addresses: 0100 *1111* through 0100 *0010* |
| 0100 0010 → 0100 |
| 0100 0011 → 0100 |
| 0100 0100 → 0100 |
| 0100 0101 → 0100 |
| 0100 0110 → 0100 |
| 0100 0111 → 0100 |
| 0100 1000 → 0100 |
| 0100 1001 → 0100 |
| 0100 1010 → 0100 |
| 0100 1011 → 0100 |
| 0100 1100 → 0100 |
| 0100 1101 → 0100 |
| 0100 1110 → 0100 |
| 0100 1111 → 0100 |
| 0101 0000 → not used |
| Through |
| 1100 0111 → not used |

FIG. 9E

| Memory Plane 990 |
|---|
| Addresses: 0000 *1100* through 0000 *0100* |
| 0000 0100 → 0001 |
| 0000 0101 → 0001 |
| 0000 0110 → 0001 |
| 0000 0111 → 0001 |
| 0000 1000 → 0001 |
| 0000 1001 → 0001 |
| 0000 1010 → 0001 |
| 0000 1011 → 0001 |
| 0000 1100 → 0001 |
| 0000 1101 → 0000 not used |
| 0000 1110 → 0000 not used |
| 0000 1111 → 0000 not used |

FIG. 9D

| Memory Plane 993 |
|---|
| Addresses: 1100 *1100* through 1100 *1000* |
| 1100 1000 → 1000 |
| 1100 1001 → 1000 |
| 1100 1010 → 1000 |
| 1100 1011 → 1000 |
| 1100 1100 → 1000 |
| 1100 1101 → not used |
| Through |
| 1111 1111 → not used |

FIG. 9F

Memory Plane 991

Addresses: *0011 1111* through *0001 0000*

| | | | |
|---|---|---|---|
| 0001 0000 | → 0010 | | |
| 0001 0001 | → 0010 | | |
| 0001 0010 | → 0010 | | |
| 0001 0011 | → 0010 | | |
| 0001 0100 | → 0010 | | |
| 0001 0101 | → 0010 | | |
| 0001 0110 | → 0010 | | |
| 0001 0111 | → 0010 | | |
| 0001 1000 | → 0010 | | |
| 0001 1001 | → 0010 | | |
| 0001 1010 | → 0010 | | |
| 0001 1011 | → 0010 | | |
| 0001 1100 | → 0010 | | |
| 0001 1101 | → 0010 | | |
| 0001 1110 | → 0010 | | |
| 0001 1111 | → 0010 | | |
| next | | next | |
| 0010 0000 | → 0010 | 0011 0000 | → 0010 |
| 0010 0001 | → 0010 | 0011 0001 | → 0010 |
| 0010 0010 | → 0010 | 0011 0010 | → 0010 |
| 0010 0011 | → 0010 | 0011 0011 | → 0010 |
| 0010 0100 | → 0010 | 0011 0100 | → 0010 |
| 0010 0101 | → 0010 | 0011 0101 | → 0010 |
| 0010 0110 | → 0010 | 0011 0110 | → 0010 |
| 0010 0111 | → 0010 | 0011 0111 | → 0010 |
| 0010 1000 | → 0010 | 0011 1000 | → 0010 |
| 0010 1001 | → 0010 | 0011 1001 | → 0010 |
| 0010 1010 | → 0010 | 0011 1010 | → 0010 |
| 0010 1011 | → 0010 | 0011 1011 | → 0010 |
| 0010 1100 | → 0010 | 0011 1100 | → 0010 |
| 0010 1101 | → 0010 | 0011 1101 | → 0010 |
| 0010 1110 | → 0010 | 0011 1110 | → 0010 |
| 0010 1111 | → 0010 | 0011 1111 | → 0010 |
| | | 0100 0000 | → not used |
| | | 0100 0001 | → not used |

FIG. 9G

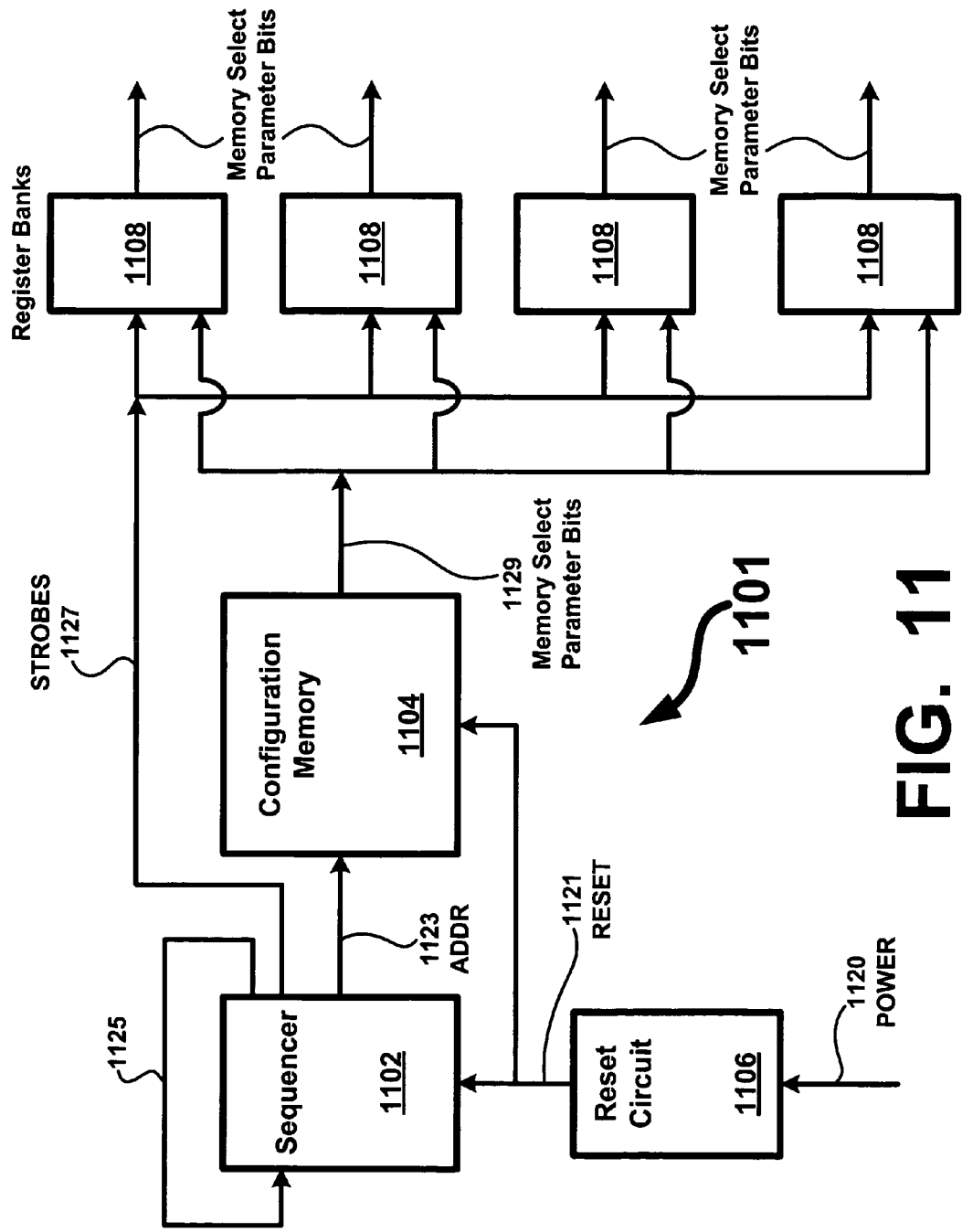

US 8,064,284 B2

METHOD FOR ACCESSING VERTICALLY STACKED EMBEDDED NON-FLASH RE-WRITABLE NON-VOLATILE MEMORY

FIELD OF THE INVENTION

The present invention relates to computing systems and, more particularly, to memory devices.

BACKGROUND

Computing systems typically have different memory type needs. As a result, computing systems usually include different memory devices. For example, FIG. 1 shows a conventional computing system that includes disk controller 101 in communication with peripheral devices 102. The components of disk controller 101 and peripheral devices 102 (e.g., fibre channel controller 112, data path controller 106, processors 108 and 110, and Small Computer System Interface (SCSI) controllers 114) can have different memory type needs. For instance, fibre channel controller 112 uses electrically-erasable programmable read-only memory (EEPROM) 116 during system boots while processor 108 uses static random access memory (SRAM) 117 for fast, temporary storage operations. The problem with the conventional computing system of FIG. 1 is that all the different memory devices (i.e., EEPROMs 116, FLASH memories 118, SRAMs 117, and dynamic random access memories DRAMs 120) occupy a large amount of valuable board space. Furthermore, processing power must be allocated to drive all the different memory devices.

There are continuing efforts to satisfy the memory needs of a system.

BRIEF DESCRIPTION OF THE DRAWINGS

The present invention will be readily understood by the following detailed description in conjunction with the accompanying drawings, and like reference numerals designate like structural elements.

FIG. 9C depicts an exemplary range of addresses for enabling bank selects;

FIGS. 9D through 9G depict exemplary address ranges that map to a plurality of different memory planes;

FIG. 11 depicts a schematic diagram of an exemplary circuit for outputting memory select parameters;

Although the previous Drawings depict various examples of the invention, the invention is not limited by the depicted examples. Furthermore, the depictions are not necessarily to scale.

DETAILED DESCRIPTION

The invention can be implemented in numerous ways, including as a system, a method, or an apparatus. In general, the steps of disclosed processes may be performed in an arbitrary order, unless otherwise provided in the claims.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Multiple-Type Memory

The embodiments described herein provide a multiple-type memory that can emulate more than one memory type. In general, the memory can be partitioned into multiple memory blocks, and as will be explained in more detail below, the memory blocks and their associated control logics can be configured to emulate different memory types.

Figure 1:
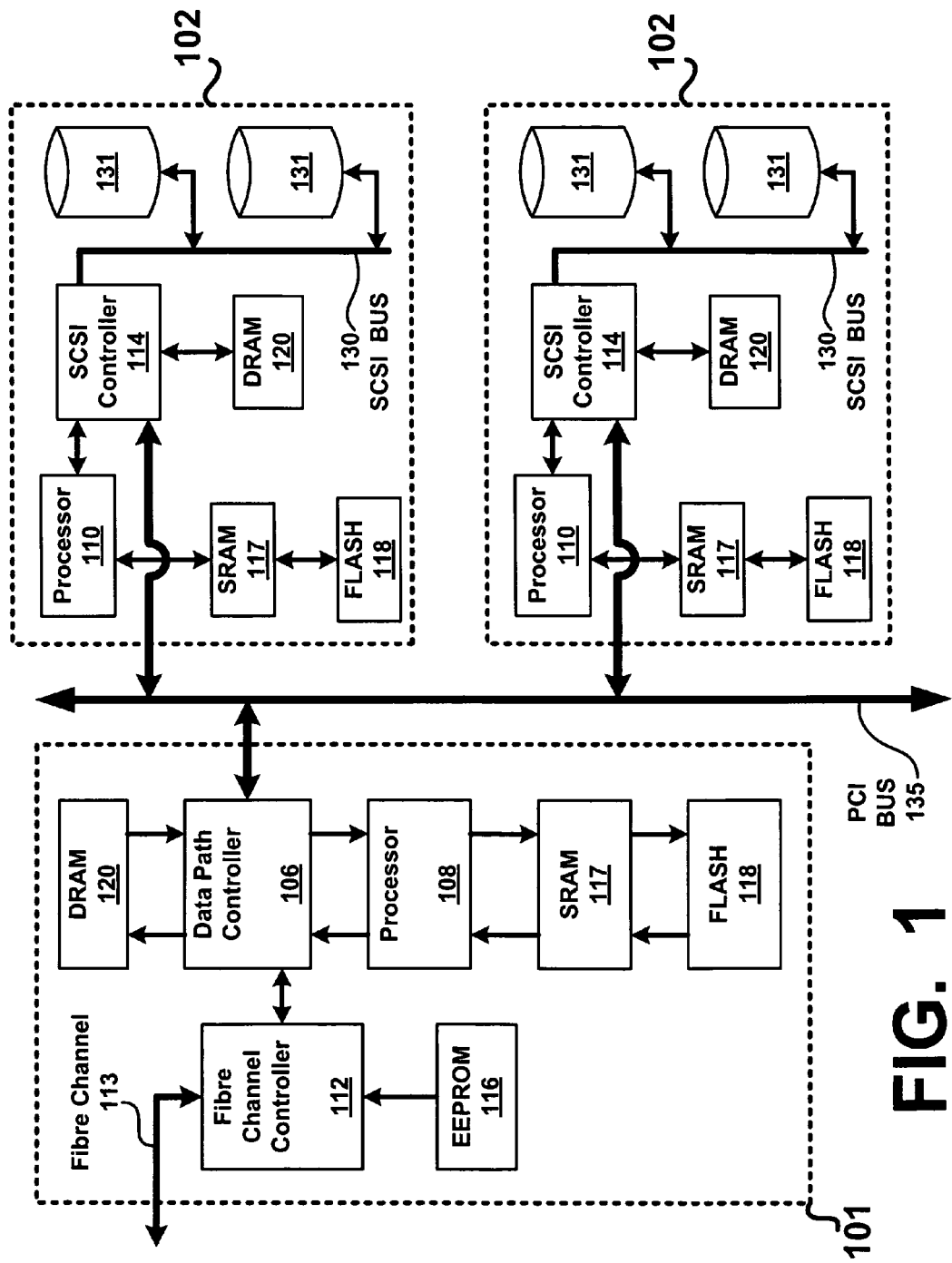
FIG. 1 depicts a conventional computing system.
Figure 2:
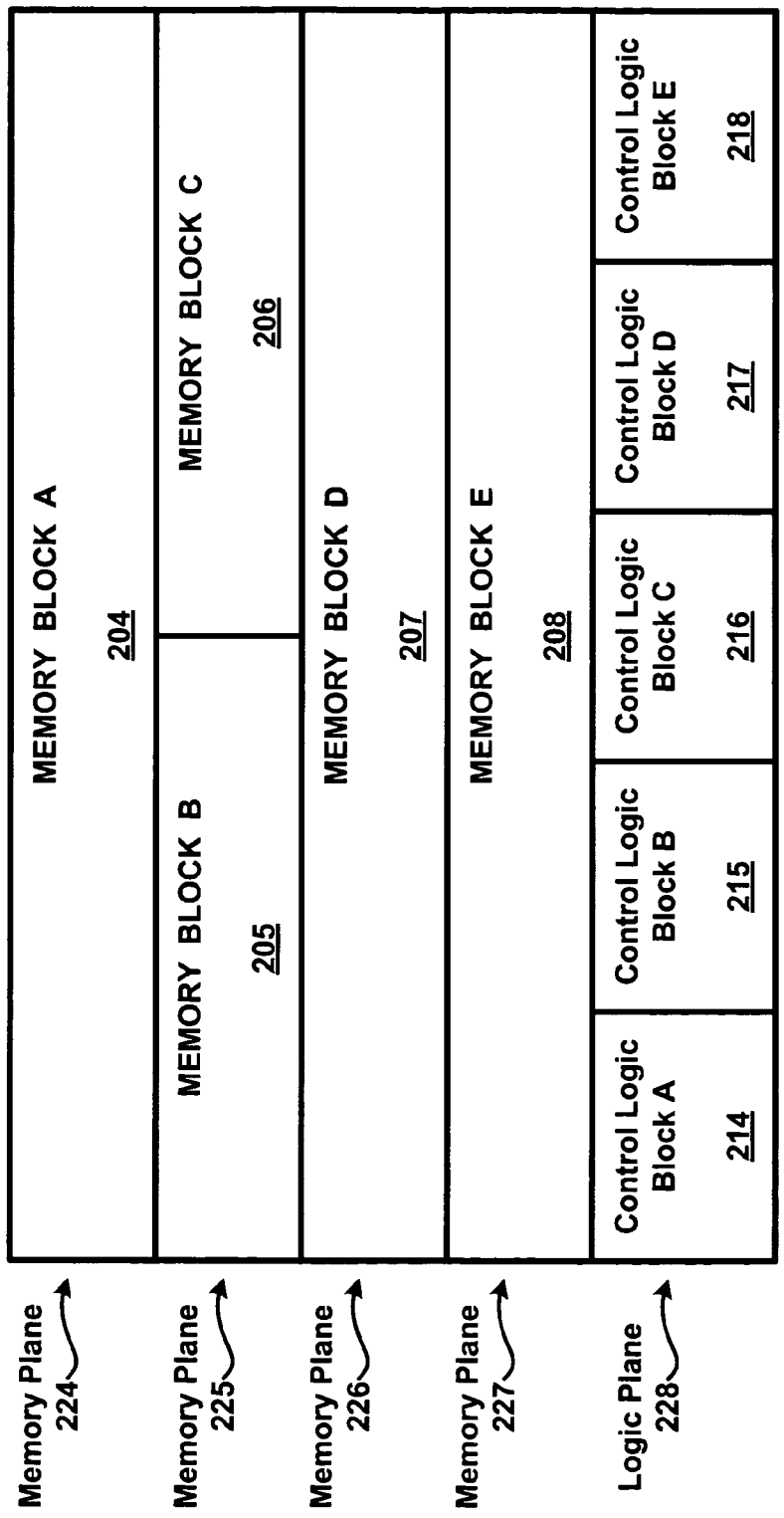
FIG. 2 depicts a block diagram of an exemplary multiple-type memory.

FIG. 2 is a block diagram of an exemplary multiple-type memory. As shown in FIG. 2, multiple-type memory 202 includes memory planes 224-227 and logic plane 228. Memory planes 224-227 are partitioned into memory blocks 204-208 and logic plane 228 is partitioned into control logic blocks 214-218. Multiple-type memory 202 can include any suitable memory that can be vertically configured along memory planes 224-227. Memory planes 224-227 can be implemented using various types of memory technologies that permit different physical and logical arrangements (e.g., vertically stacked memory arrays).

U.S. patent application Ser. No. 11/095,026, filed Mar. 30, 2005, now U.S. Published Application No. 2006/0171200, and titled "Memory Using Mixed Valence Conductive Oxides," hereby incorporated by reference in its entirety and for all purposes, describes non-volatile third dimension memory cells that can be arranged in a cross-point array. The application describes a two terminal memory element that changes conductivity when exposed to an appropriate voltage drop across the two terminals. The memory element includes both a mixed ionic electronic conductor and a layer of material that has the bulk properties of an electrolytic tunnel barrier (properties of an electronic insulator and an ionic conductor). A voltage drop across the electrolytic tunnel barrier causes an electrical field within the mixed ionic electronic conductor that is strong enough to move oxygen ions out of the mixed ionic electronic conductor and into the electrolytic tunnel barrier. Oxygen depletion causes the mixed ionic electronic conductor to change its conductivity. Both the electrolytic tunnel barrier and the mixed ionic electronic conductor do not need to operate in a silicon substrate, and, therefore, can be fabricated above circuitry being used for other purposes (e.g., selection circuitry, sense amps, and address decoders). A memory is "third dimension memory" when it is fabricated above other circuitry components, the components usually including a silicon substrate, polysilicon layers and, typically, metallization layers.

The two-terminal memory elements can be arranged in a cross-point array such that one terminal is electrically coupled with an x-direction line and the other terminal is electrically coupled with a y-direction line. A stacked cross-point array consists of multiple cross-point arrays stacked upon one another, sometimes sharing x-direction and y-direction lines between layers, and sometimes having isolated lines. When a first write voltage $V_{W1}$ is applied across the memory element, (typically by applying ½ $V_{W1}$ to the x-direction line and ½ $-V_{W1}$ to the y-direction line) it switches to a low resistive state. When a second write voltage $V_{W2}$ is applied across the memory element, (typically by applying ½ $V_{W2}$ to the x-direction line and ½ $-V_{W2}$ to the y-direction line) it switches to a high resistive state. Typically, memory elements using electrolytic tunnel barriers and mixed ionic electronic conductors require $V_{W1}$ to be opposite in polarity from $V_{W2}$.

Control logic blocks 214-218 are located within logic plane 228 of multiple-type memory 202 and include circuitries (e.g., sense amplifiers, address units, transistors, decoders, capacitors, multiplexers, drivers, power supplies, etc.) that provide control and interface functions. Each memory block 204, 205, 206, 207 or 208 corresponds to an associated control logic block 214, 215, 216, 217 or 218, respectively, and both the memory block and its associated control logic block are configured to emulate a memory type. Specifically, each memory block 204, 205, 206, 207 or 208 is logically in communication with an associated control logic block 214, 215, 216, 217 or 218, respectively. For example, as shown in FIG. 2, memory block A 204 corresponds to control logic block A 214, memory block B 205 corresponds to control logic block B 215, memory block C 206 corresponds to control logic block C 216, memory block D 207 corresponds to control logic block D 217, and memory block E 208 corresponds to control logic block E 218.

Each memory block 204, 205, 206, 207 or 208 and its associated control logic block 214, 215, 216, 217 or 218, respectively, are isolated from the other memory blocks and control logic blocks. Accordingly, each memory block 204, 205, 206, 207 or 208 and its associated control logic block 214, 215, 216, 217 or 218, respectively, are configured to function as a separate and independent memory devices. In other words, each memory block 204, 205, 206, 207 or 208 and its associated control logic block 214, 215, 216, 217 or 218, respectively, are configured to function as a single memory type. Memory blocks 204-208 and their associated control logic blocks 214-218 can emulate any suitable types of memory. An exemplary memory type is a dynamic random access memory (DRAM), which is a type of volatile dynamic memory that essentially stores each bit (i.e., data bit) in a capacitor and one or more transistors. Another exemplary memory type is a static random access memory (SRAM), which is a type of volatile memory that basically stores each bit in a series of flip-flops. Other exemplary memory types that can be emulated by memory blocks 204-208 and control logic blocks 214-218 include but are not limited to serial memories (e.g., EEPROM) and non-volatile memories (e.g., FLASH memory).

Still referring to FIG. 2, as discussed above, control logic blocks 214-218 provide control and interface functions. Since memory blocks 204-208 and their associated control logic blocks 214-218 can emulate different memory types, each control logic block can have different control and interface circuitry and characteristics. As such, each control logic block 214, 215, 216, 217 or 218 is configured to emulate the control and interface functions of one memory type. The control and interface functions of a memory type can be emulated by varying the circuitries within control logic blocks 214-218 that provide control and interface functions. For example, a buffer size can be modified, a sensitivity of a sense amplifier can be modified, and/or an aspect ratio (height/width) of a word line or bit line can be modified to emulate the different control and interface characteristics of different memory types.

Figure 3:
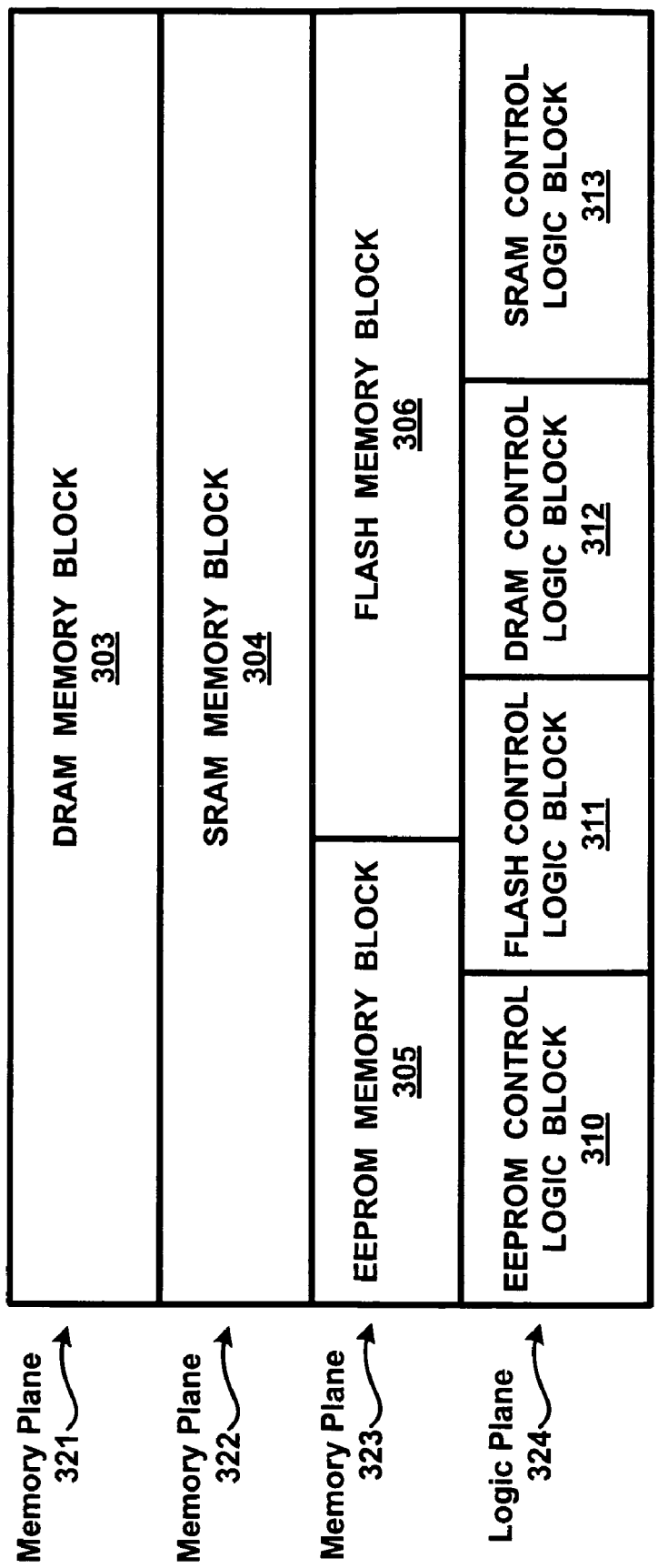
FIG. 3 depicts a block diagram of another exemplary multiple-type memory.

FIG. 3 is a block diagram of another exemplary multiple-type memory. As shown in FIG. 3, multiple-type memory 301 includes memory planes 321-323 and logic plane 324. Memory planes 321-323 and logic plane 324 are partitioned into memory blocks 303-306 and control logic blocks 310-313, respectively. Each memory block 303, 304, 305 or 306 corresponds to an associated control logic block 310, 311, 312, or 313 and both the memory block and its associated control logic block are configured to emulate a memory type. In the example of FIG. 3, memory block 303 corresponds to control logic block 312 and both the memory block and the control logic block are configured to emulate a DRAM. Memory block 304 corresponds to control logic block 313 and both the memory block and the control logic block are configured to emulate an SRAM. Memory block 305 corresponds to control logic block 310 and both the memory block and the control logic block are configured to emulate an EEPROM. Furthermore, memory block 306 corresponds to control logic block 311 and both the memory block and the control logic block are configured to emulate a FLASH memory.

Each control logic block 310, 311, 312, or 313 is configured to emulate the control and interface functions of an EEPROM, a FLASH memory, a DRAM, or an SRAM. As discussed above, the control and interface functions of a memory type can be emulated by varying the circuitries within control logic blocks 310-313 that provide control and interface functions. For example, when compared to other control logic blocks 310-312, SRAM control logic block 313 can include circuitries that are optimized for speed with larger drivers and more sensitive sense amplifiers. In another example, when compared to other control logic blocks 310, 312, and 313, FLASH control logic block 311 can include circuitries that are optimized for power savings.

Figure 4:
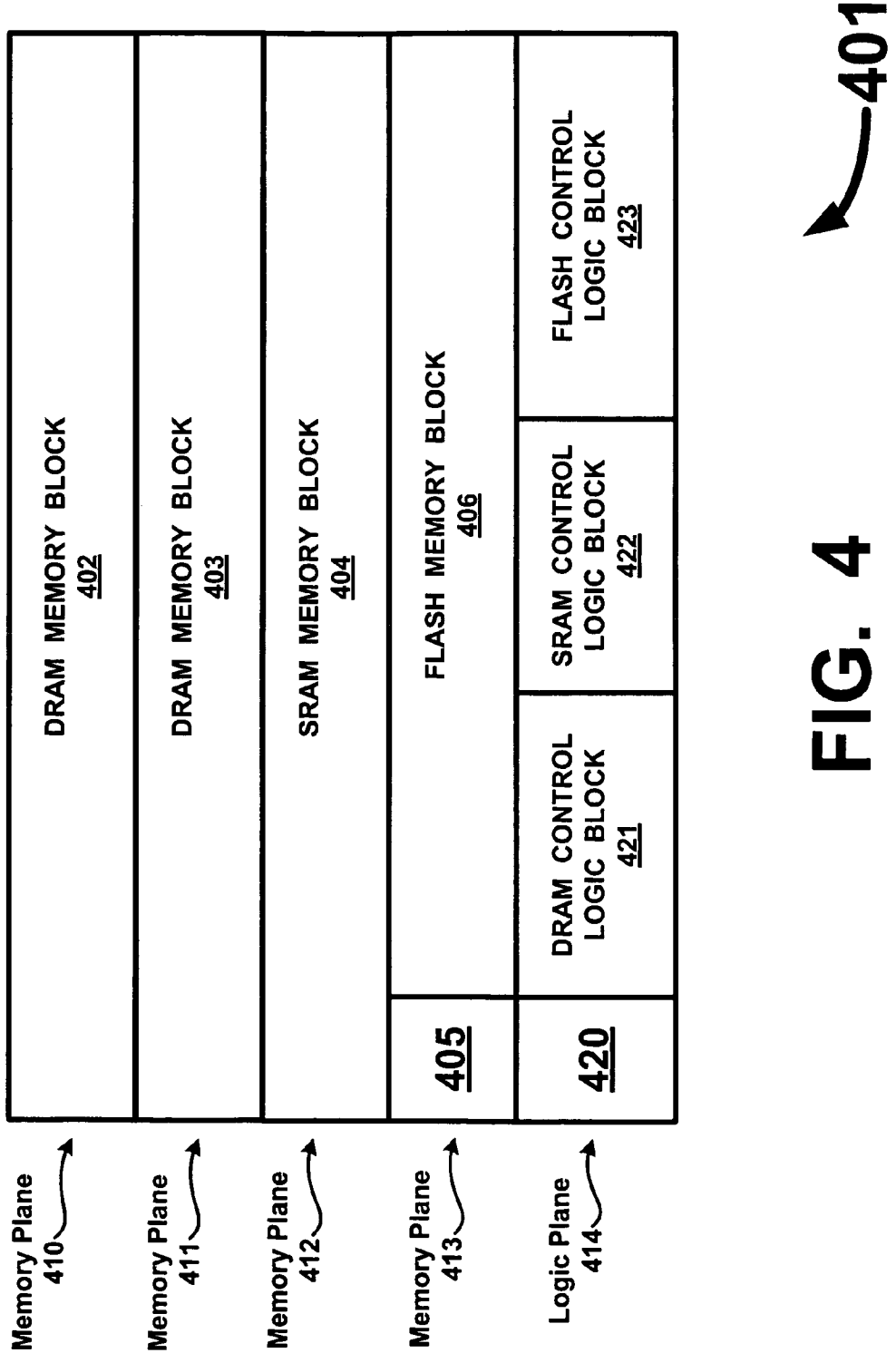
FIG. 4 depicts a block diagram of still another exemplary multiple-type memory.

FIG. 4 is a block diagram of still another exemplary multiple-type memory. It should be appreciated that multiple-type memory 401 can be partitioned into any suitable sized memory blocks 402-406 and each control block 420, 421, 422 or 423 can correspond to one or more of the memory blocks. As shown in FIG. 4, multiple-type memory 401 includes memory planes 410-413 and logic plane 414. Memory planes 410-413 and logic plane 414 are partitioned into memory blocks 402-406 and control logic blocks 420-423, respectively. In this example, both memory blocks 402 and 403 correspond to control logic block 421 and both the memory blocks and the control logic block are configured to emulate a DRAM. Memory block 404 corresponds to control logic block 422 and both the memory block and the control logic block are configured to emulate an SRAM. Memory block 406 corresponds to control logic block 423 and both the memory block and the control logic block are configured to emulate a FLASH memory. Memory block 405 corresponds to control logic block 420 and, as will be explained in more detail below, both the memory block and the control logic block can be reserved for functions associated with memory decoding and configuration.

Figure 5:
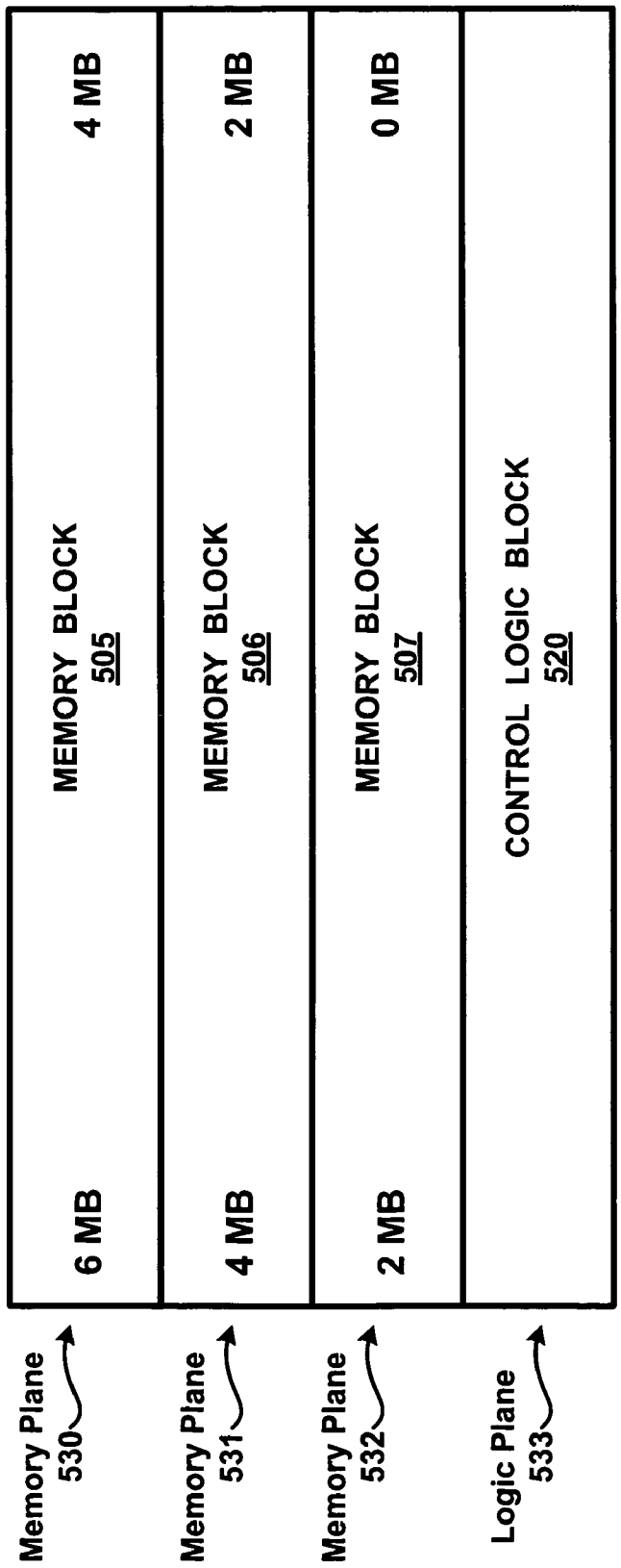
FIG. 5 depicts a block diagram of an exemplary multiple-type memory with dynamically allocated memory blocks.

FIG. 5 is a block diagram of an exemplary multiple-type memory with dynamically allocated memory blocks. In one embodiment, the memory size of a memory type can be adjusted. The memory size can be adjusted by dynamically allocating one or more memory blocks 505-507 to a memory type. For instance, as shown in FIG. 5, multiple-type memory 501 includes memory planes 530-532 and logic plane 533. Memory planes 530-532 are partitioned into memory blocks 505-507 and, in the example of FIG. 5, each memory block is two megabytes in size. It should be appreciated that multiple-type memory 501 can be partitioned into any suitable sized memory blocks 505-507.

One or more memory blocks 505-507 can correspond to control logic block 520, and the memory blocks and the control logic block are configured to emulate a single memory type. Depending on the memory requirements of a system, the memory size of the single memory type can be adjusted. For example, if the system requires two megabytes of a memory type, then memory block 507 is configured to correspond with control logic block 520. If the system further requires an additional two megabytes of the same memory type, then both memory blocks 506 and 507 are allocated to the memory type and, as such, both the memory blocks 506 and 507 are configured to correspond with control logic block 520. If the system requires six megabytes of the same memory type, then memory blocks 505-507 are configured to correspond with control block 520. Accordingly, one or more memory blocks 505-507 can be dynamically allocated to the same memory type depending on the memory needs of a system.

Figure 6:
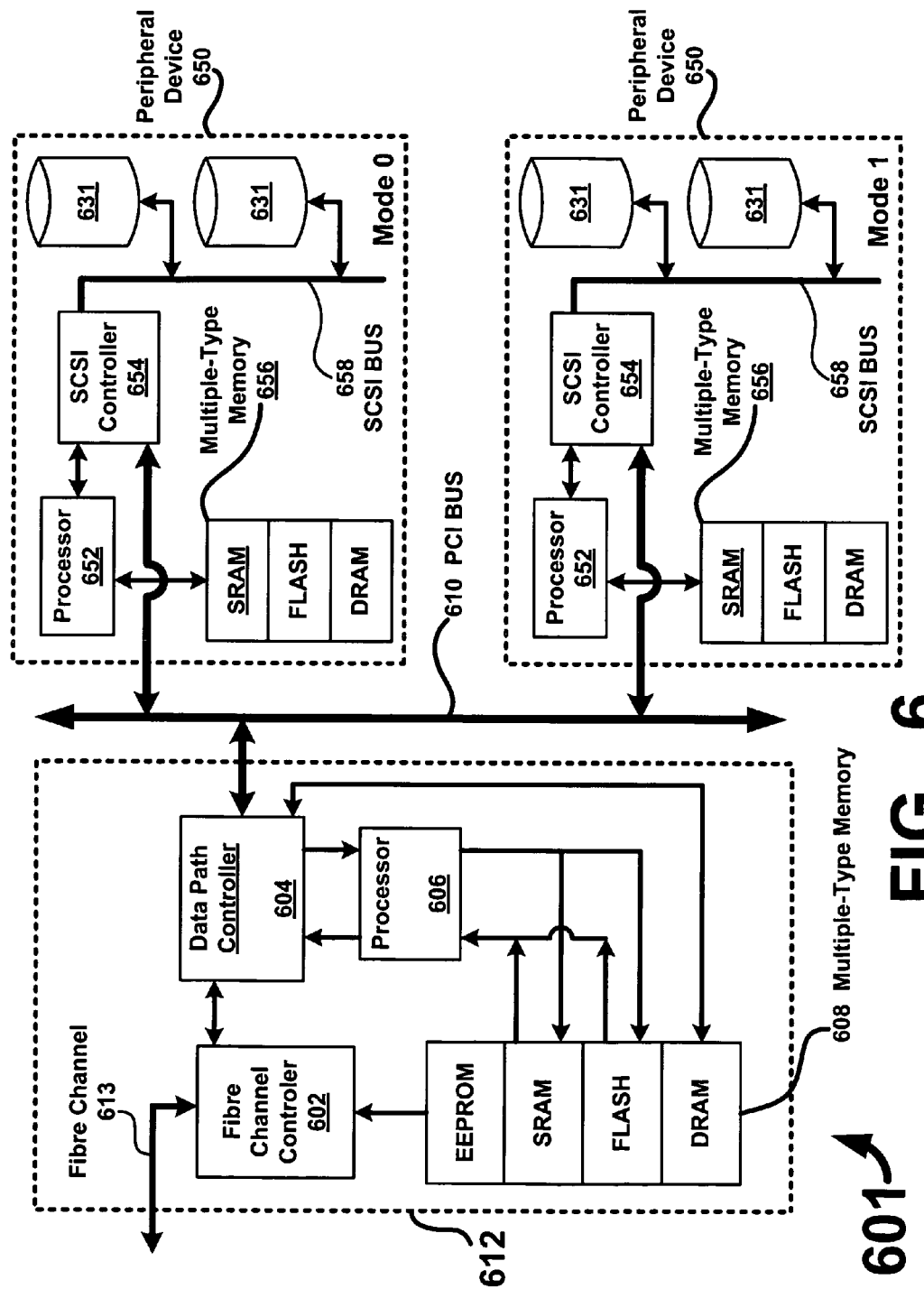
FIG. 6 depicts a block diagram of an exemplary system that utilizes a plurality of multiple-type memories.

FIG. 6 is a block diagram of an exemplary system that utilizes multiple-type memories. System 601 includes disk controller 612 in communication with peripheral devices 650 through Peripheral Component Interconnect (PCI) bus 610. Disk controller 612 includes fibre channel controller 602, multiple-type memory 608, data path controller 604, and processor 606. Peripheral devices 650 can include any suitable devices attached to a computing device, such as the disk controller 612, which expands the functionality of the computing devices. Exemplary peripheral devices 650 include hard disk drives, tape drives, random access memory (RAM) drives, network adapters, etc. For example, in system 601, each peripheral device 650 includes processor 652, multiple-type memory 656, and Small Computer System Interface (SCSI) controller 654.

The components included in disk controller 612 and peripheral devices 650 (e.g., processors 606 and 652, data path controller 604, SCSI controllers 654, etc.) can be in communication within the disk controller 612 or within the peripheral devices through common buses. It should be appreciated that fibre channel controller 602 provides the processing and hardware control for fibre channel technology, which is a technology for transmitting data between computing devices at high data rates. Data path controller 604 (e.g., a direct memory access (DMA) controller) essentially is a processor that processes the transfer of data to and from multiple-type memory 608 and peripheral devices. Similarly, SCSI controllers 654 included in peripheral devices 650 control data transfers between components 631 on SCSI bus interfaces 658.

Fibre channel controller 602, data path controller 604, SCSI controllers 654, and processors 606 and 652 of system 601 can have different memory type needs. For instance, fibre channel controller 602 uses an EEPROM during system boots, while processors 606 and 652 use FLASH memory for system boots and for storing key operating tables. Additionally, processors 606 and 652 use SRAM for fast, temporary storage operations and use DRAM to store packets, data, and some key operation tables of the processor. With multiple-type memories 608 and 656 that are configured to emulate a variety of memory types (e.g., EEPROM, SRAM, FLASH, DRAM, etc.), components within disk controller 612 and peripheral devices 650 can access the multiple-type memories for all their memory type needs. For example, as shown in FIG. 6, multiple-type memory 608 of disk controller 612 can emulate an EEPROM, a SRAM, a FLASH memory, and a DRAM. As a result, processor 606 can access multiple-type memory 608 for all its memory type needs. Similarly, multiple-type memories 656 of peripheral devices 650 can emulate SRAM, FLASH memory, and DRAM. Accordingly, processors 652 can access multiple-type memories 656 for their memory type needs.

Figure 7:
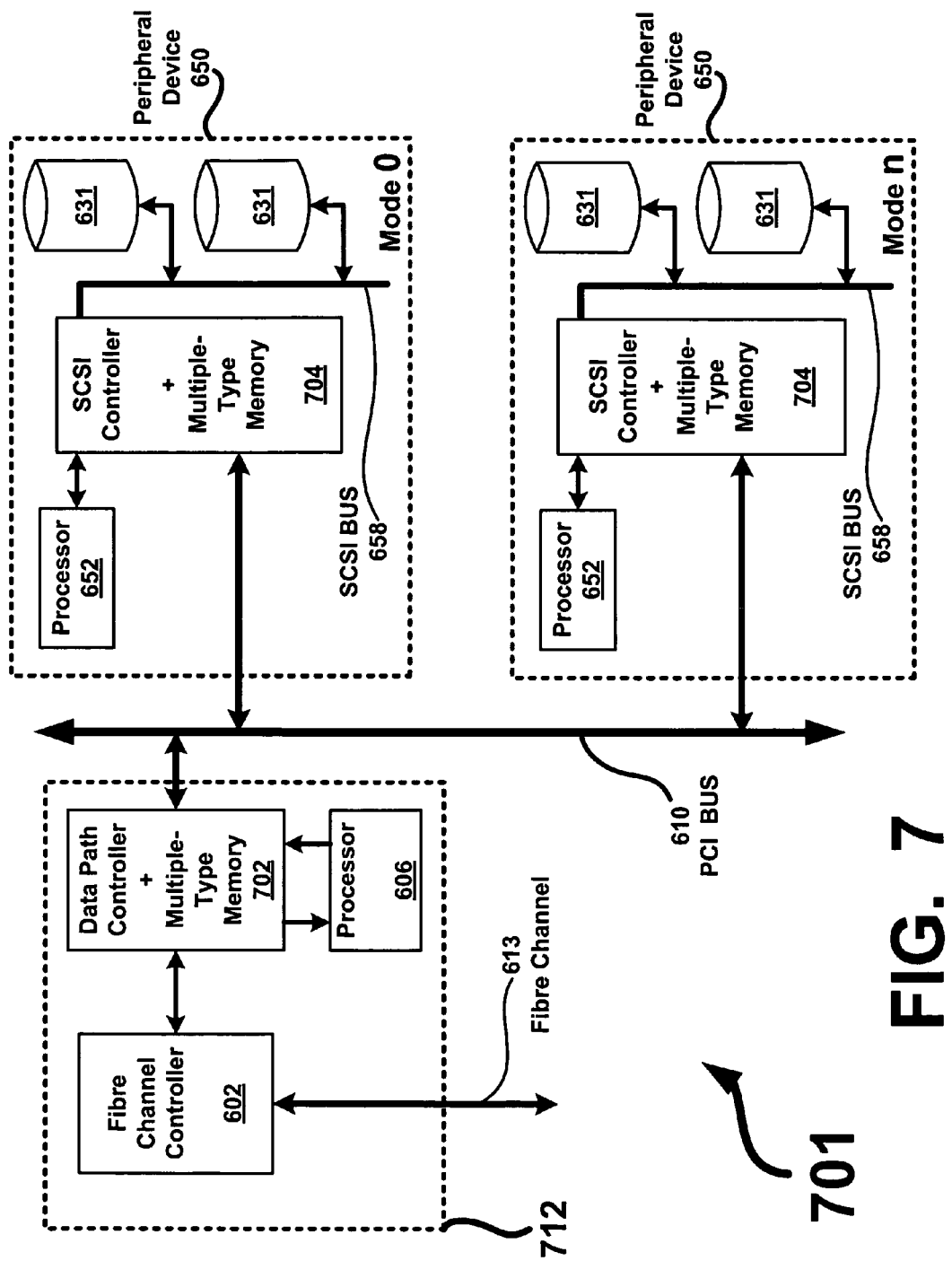
FIG. 7 depicts a block diagram of another exemplary system that utilizes a plurality of multiple-type memories.

FIG. 7 is a block diagram of an alternative embodiment of an exemplary system that utilizes multiple-type memories. Similar to the system of FIG. 6, system 701 shown in FIG. 7 includes disk controller 712 in communication with peripheral devices 650. However, instead of having separate multiple-type memory, the data path controller and multiple-type memory of disk controller 712 are integrated into a single data path controller and multiple-type memory chip 702. Similarly, the SCSI controller and multiple-type memory of each peripheral device 650 are integrated into a single SCSI controller and multiple-type memory chip 704. As discussed above, the multiple-type memories integrated into data path controller and multiple-type memory chip 702 and SCSI controller and multiple-type memory chips 704 are configured to emulate a variety of memory types. Accordingly, components within disk controller 712 and peripheral devices 650 can access data path controller and multiple-type memory chip 702 and SCSI controller and multiple-type memory chip 704, respectively, for all their memory type needs.

In summary, the above-described embodiments provide multiple-type memories. To satisfy the various memory type needs of a system, a multiple-type memory is partitioned into separate memory blocks that are configured to emulate the various memory types. As discussed above, the memory blocks of the multiple-type memory can be dynamically allocated. Accordingly, in addition to meeting the different memory type needs of a system, the multiple-type memory can also meet and adapt to the changing memory requirements of a system. Additionally, a single multiple-type memory has a smaller profile when compared to the space occupied by multiple memory devices. Processing power is also more efficiently used when accessing the multiple-type memory because accessing one multiple-type memory requires less processing power when compared to accessing multiple memory devices. As a result, when compared to the access of multiple memory devices, the use of a multiple-type memory saves energy, reduces processing power, and reduces the physical size of a system.

Memory Address Decoder and Look-Up Table

The embodiments described herein provide methods, circuitries, and one or more look-up tables for selecting a memory address range within a system. As will be explained in more detail below, a memory can include decode logic or look-up table to identify a memory address to which a memory (e.g., a main memory or a particular expansion memory) is to respond.

Figure 8:
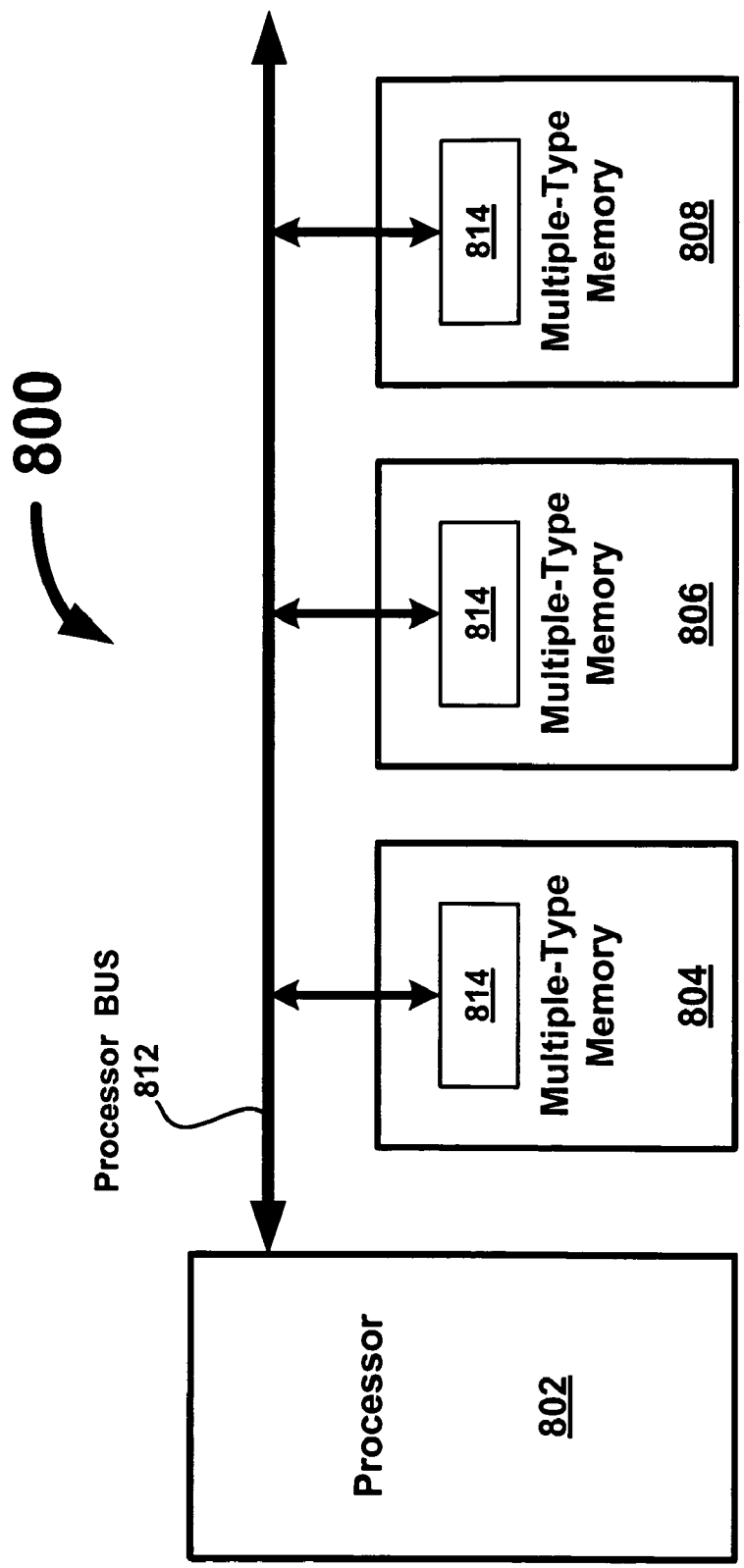
FIG. 8 depicts a block diagram of an exemplary system for decoding memory selects.

FIG. 8 is a block diagram of an exemplary system for decoding memory selects. As shown in FIG. 8, system 800 includes processor 802 and multiple-type memories 804, 806 and 808. Processor 802 and multiple-type memories 804, 806 and 808 can be in communication though a common bus (e.g., processor bus 812) within system 800. To determine whether to access multiple-type memory 804, multiple-type memory 806, or multiple-type memory 808, each of the memories can include decode logic 814 to decode a memory address to determine a memory select value. The memory select value indicates one of multiple-type memory 804, multiple-type memory 806, or multiple-type memory 808. In other words, each multiple-type memory 804, 806 and 808 can include decode logic 814 that identifies which multiple-type memory (i.e., 804, 806, or 808) responds to a memory address on bus 812. As will be explained in more detail below, decode logic 814 can include circuitries configured to recognize a memory select value from a memory address. It should be appreciated that multiple-type memories 804, 806 and 808 can include any suitable memory. For instance, a suitable memory can include the above-discussed vertically configured memory.

Figure 9A:
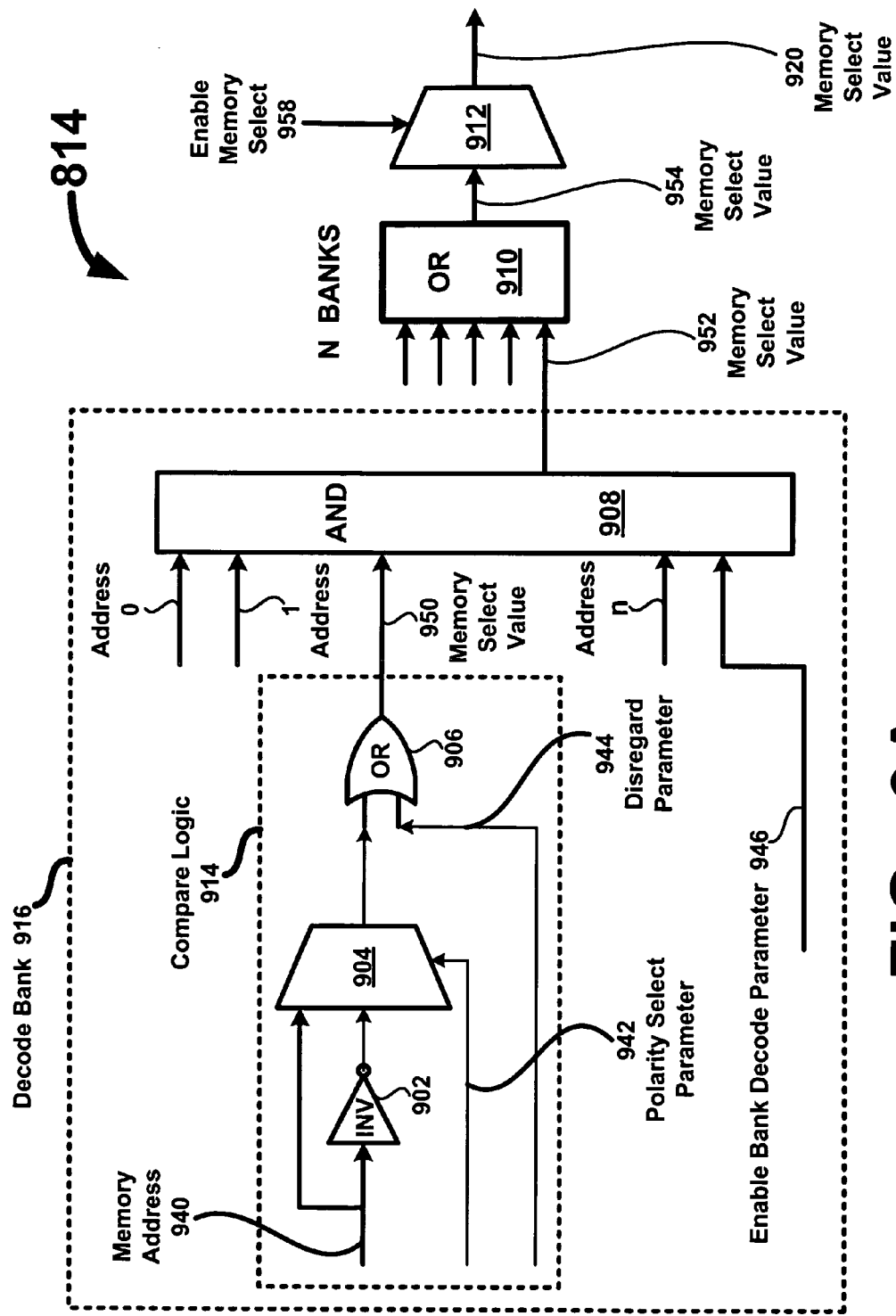
FIG. 9A is a schematic diagram depicting an exemplary decode logic.

FIG. 9A depicts a schematic diagram of an exemplary decode logic. Decode logic 814 includes one or more decode banks, such as decode bank 916, and one or more compare logics, such as compare logic 914. In the embodiment of FIG. 9A, compare logic 914 receives and decodes a bit of memory address 940. Since each compare logic, such as compare logic 914, corresponds to an associated bit of memory address 940 that is to be decoded, decode logic 814 may have multiple compare logics if the decode logic is configured to decode multiple bits of the memory address.

In general, compare logic 914 is configured to decode a bit of memory address to memory select value 950 which indicates one memory. As shown in FIG. 9A, compare logic 914 includes inverter 902, selection circuitry 904, and OR gate 906. Selection circuitry 904, which is in communication with the inverter 902 and the OR gate 906, selects either a bit of memory address 940 or an inverse of the bit of the memory address for output. It should be appreciated that selection circuitry 904 may be a 2:1 multiplexer (MUX). The output selection depends on polarity select parameter 942, which is one parameter of a set of memory select parameters. Essentially, the memory select parameters specify a memory select value and are used to decode a portion of memory address 940. The memory select parameters are predetermined and, as will be explained in more detail below, may be preloaded and stored in a memory array. Exemplary memory select parameters include polarity select parameter 942, disregard parameter 944, and enable bank decode parameter 946. Polarity select parameter 942 selects the polarity of the bit from memory address 940 (e.g., zero bit or one bit). Decode logic 814 may disregard some bit values of memory address 940. As a result, disregard parameter 944 specifies whether the bit outputted from selection circuitry 904 should be ignored. Enable bank decode parameter 946 specifies the enablement of compare logic 914.

The OR gate 906 is configured to output memory select value 950 based on output of selection circuitry 904 and to disregard parameter 944. As discussed above, disregard parameter 944 specifies whether the bit outputted from selection circuitry 904 should be ignored. Thus, if decode logic 814 disregards the bit outputted from selection circuitry 904, then disregard parameter 944 is enabled such that OR gate 906 outputs the disregard parameter, which indicates to the decode logic that the bit is irrelevant and should be ignored. On the other hand, if the bit outputted from selection circuitry 904 is relevant, then disregard parameter 944 is disabled such that OR gate 906 outputs the bit value from the selection circuitry.

Still referring to FIG. 9A, AND gate 908 thereafter receives memory select values, such as memory select value 950, from all compare logics, such as compare logic 914, associated with memory addresses "0" to "n", and outputs memory select value 952. An OR gate 910 combines all the memory select values, such as memory select value 952, from all decode banks, such as decode bank 916, to output memory select value 954. Selection circuitry 912 then selects memory select value 954 for output. The output selection depends on enable memory select 958. Decode logic 814 includes multiple decode banks, such as decode bank 916, that are applied to OR gate 910. Accordingly, enable memory select 958 specifies the enablement of decode bank 916. Memory select value 920 outputted from selection circuitry 912 indicates a memory select.

Decode logic 814 basically compares a decoded memory select value with a predetermined memory select value specified by memory select parameters (e.g., polarity select parameter 942, disregard parameter 944, etc.). If the decoded memory select value matches the predetermined memory select value, then decode logic 814 outputs memory select value 920. However, if the decoded memory select value is different from the predetermined memory select value, then decode logic 814 outputs a non-select value.

To further illustrate the above-described embodiments, an exemplary decoding operation of a sixteen bit memory address is provided. In this exemplary operation, the sixteen bit memory address assigned to a decode logic, such as decode logic 814, ranges from 0000 0100 0000 0000 to 0001 1111 1111 1111 with memory addresses 0 to 15 from right to left. A portion of the sixteen bit memory address is decoded to a memory select value, such as memory select value 920. It should be appreciated that all or any suitable portion of memory address can be decoded. For example, a portion may include the most significant bits or the least significant bits. In this example, the most significant bits with memory addresses 10-15 are decoded to a memory select value. Bits associated with memory addresses 0-9 are not relevant and, therefore, not decoded. Three decode banks (e.g., decode bank 916) are enabled to decode the six bits with memory addresses 10-15. For example, with decode bank 0 enabled (e.g., enabled by enable bank decode parameter 946), bits with memory addresses 11-15 inverted (e.g., inverted by polarity select parameter 942), and the disregard parameter (e.g., disregard parameter 944) on all memory addresses 10-15 disabled, decode logic 814 outputs a memory select value of 0000 01. Further, with decode bank 1 enabled, bits with memory addresses 12-15 inverted, bit with memory address 11 not inverted, and the disregard parameter for bit with memory address 10 enabled, decode logic outputs a memory select value of 0000 1x, where "x" represents a bit that is ignored. Finally, with decode bank 2 enabled, bit with memory address 12 not inverted, and the disregard parameter for bits with memory addresses 10 and 11 enabled, decode logic outputs a memory select value of 0001 xx. Decode banks 3, 4, and 5 are disabled and enable memory select value 954 is set. With the above-described memory select parameters, decode logic 814 can recognize the specified memory select value from a memory address and respond by selecting a memory when a bus match is found. If a match is not found, then decode logic 814 outputs a non-select value.

As an alternative to the exemplary decoder of FIG. 9A, a memory may use one or more look-up tables to indicate a memory. Specifically, the memory can include at least one look-up-table that is configured to store memory addresses and memory select values. The look-up table can have any suitable type of data structure (e.g., arrays, tables, etc.) and, in one embodiment, the look-up table can include a data structure that stores portions of the memory addresses and the memory select values, where each memory address is linked to an associated memory select value. For example, a memory address can be linked to a memory select value by both having the same index value. To determine a memory select value, a lookup operation is conducted to match a portion of the memory address with a memory address value in the look-up table.

An exemplary look-up table can be implemented using a third dimension memory positioned in one of the memory planes that is vertically disposed over the logic plane. Typically, a size of the look-up table is small relative to other arrays in the memory plane and therefore requires minimal area to implement. The memory select values can be set in a variety of ways. As one example, the memory select values can be set once at configuration time and then can be permanently used in detecting address ranges for determining memory selects within the array itself. As another example, in some embodiments, it may be desirable to dynamically set the memory select values or to statically set the memory select values at power up. If the main array is used to detect one address range, then the look-up table would have one output. If the array was to support several memory ranges or memory types, then additional memory outputs can be added to the look-up table. One bit being used for each memory range or memory type. In addition to this capability, the look-up table could be used to support a Read only functionality for support of memory types to act as ROMs or write protected RAM memory.

Figure 9B:
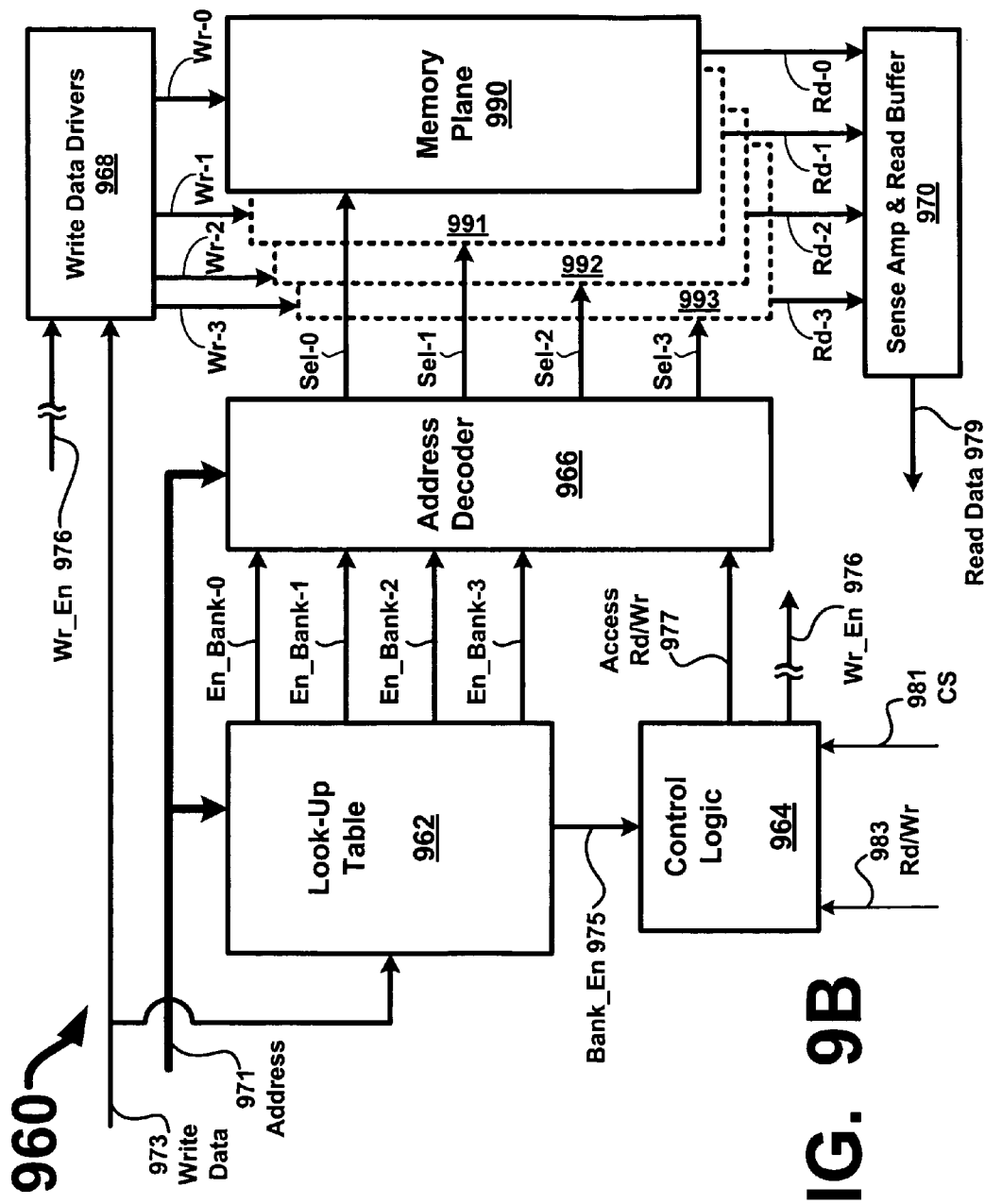
FIG. 9B is a schematic diagram depicting an exemplary decode logic including a look-up table.

FIG. 9B depicts an exemplary decode logic 960 including a look-up table 962 for determining memory selects. The decode logic 960 includes control logic 964, address decoder 966, write data drivers 968, sense amp and read buffer 970, and memory planes 990, 991, 992, and 993. The decode logic 960 can include more or fewer memory planes than depicted in FIG. 9B and each memory plane may include at least one memory block. The look-up table 962 is implemented using third dimension memory and is positioned in one of the memory planes and the memory planes may be positioned over a substrate including circuitry that is electrically coupled with the memory planes and the look-up table 962. The look-up table 962 is coupled with signals including an address 971 and write data 973 (e.g., data to be written to a memory bank). Look-up table 962 generates bank enable signals En_Bank-0, En_Bank-1, En_Bank-2, and En_Bank-3, based on the address 971. The address decoder 966 is coupled with the bank enable signals and generates memory select signals Sel-0, Sel-1, Sel-2, and Sel-3 that are operative to enable data operations to a specific memory bank within the address range enabled by the look-up table 962. The look-up table 962 uses one or more of the most significant bits of the address 971 to select memory planes 990, 991, 992, and 993, and optionally, memory blocks within each memory plane. The write data 973 is coupled with write data drivers 968 for writing data to a selected memory plane during a valid write operation and is coupled with the look-up table 962 to initialize the look-up table 962 to respond to selected incoming addresses on address 971. The initialization allows a designer to select which address spaces the memory planes are designed into and to partition the memory accordingly on an application specific basis. Therefore, write data 973 serves dual purposes of writing normal data to selected memory planes during valid write operations and initializing the look-up table 962.

Control logic 964 is coupled with a plurality of input signals that include but are not limited to a chip select CS 981, read/write Rd/Wr 983, bank write enable Bank_Wr_En 975 and generates a plurality of output signals including but not limited to read/write access Access Rd/Wr 977 and write enable Wr_En 976. As one example, a data operation to the third dimension memory would commence with CS 981 going active along with Rd/Wr 977 (e.g., Rd=logic 0 and Wr=logic 1), an address on Address 971, and for a write operation, write data on Write Data 973. If the address on Address 971 maps to the range in look-up table 962, then the Look-up table 962 activates Bank_Wr_En 975 which in turn signals control logic 964 to activate Access Rd/Wr 977 so that the address decoder 966 can generate one of the memory select signals Sel-0, Sel-1, Sel-2, or Sel-3 based on which of the bank enable signals En_Bank-0, En_Bank-1, En_Bank-2, or En_Bank-3 has gone active. For a read operation (e.g., Rd/Wr 983=logic 0), the address decoder 966 selects which memory plane 990, 991, 992, or 993 data is to be read from (i.e., via Rd-0, Rd-1, Rd-2, or Rd-3) and the sense amp and read buffer 970 outputs valid read data on Read Data 979. For a write operation to a memory plane (e.g., Rd/Wr 983=logic 1), Wr_En 976 goes active to enable the Write Data Drivers 968 to drive Write Data 973 to the selected memory plane via Wr-0, Wr-1, Wr-2, or Wr-3.

In some applications, the look-up table 962 can be initialized to block write access to an address or address range in one or more of the memory planes. Accordingly, when a restricted address 971 is received by the look-up table 962, the Bank_Wr_En 975 is deactivated such that the write data drivers 968 are disabled (e.g., Wr_En 976 is inactive). The control logic 964 can be configured to allow read access to the prohibited address(es) such that Access Rd/Wr 977 enables the address decoder 966 to initiate a read operation.

Reference is now made to FIG. 9C, where exemplary input address ranges for bank selects Sel-0, Sel-1, Sel-2, and Sel-3 are depicted. In this example, the look-up table 962 is loaded (i.e., initialized) with write data 973 corresponding to a range of upper address bits of the address 971. Specifically, the write data 973 comprises the uppermost 8-bits of the address 971. Addresses in a range 0000 0000 through 0000 0011 are not used by the look-up table 962 and address in that range are inoperative to activate the bank selects so that all of the bank selects are logic 0 (i.e., 0000) for addresses within that range. Furthermore, for bank selects Sel-0, Sel-2, and Sel-3, the uppermost 4-bits of the 8-bits do not change as depicted in bold type-face and only the lowermost 4-bits change as depicted in italic type face. In contrast, all 8-bits of the address change for bank select Sel-1 as depicted in italic type face. In FIG. 9D, when the upper 8-bits of address 971 are in the range of 0000 1100 through 0000 0100, then En_Bank-0 goes active (e.g., logic 1) and the address decoder 966 activates Sel-0 (e.g., logic 1) and memory plane 990 is selected for a data operation. In FIG. 9E, when the upper 8-bits of address 971 are in the range of 0100 1111 through 0100 0010, then En_Bank-2 goes active (e.g., logic 1) and the address decoder 966 activates Sel-2 (e.g., logic 1) and memory plane 992 is selected for a data operation. In FIG. 9F, when the upper 8-bits of address 971 are in the range of 1100 1100 through 1100 1000, then En_Bank-3 goes active (e.g., logic 1) and the address decoder 966 activates Set-3 (e.g., logic 1) and memory plane 993 is selected for a data operation. In FIG. 9G, when the upper 8-bits of address 971 are in the range of 0011 1111 through 0001 0000, then En_Bank-1 goes active (e.g., logic 1) and the address decoder 966 activates Set-1 (e.g., logic 1) and memory plane 991 is selected for a data operation.

One advantage of using the look-up table 962 is that the range of addresses can be tailored to a specific application and the address ranges for each memory plane can be different with some memory planes responding to a larger range of addresses and other memory planes responding to a smaller range of addresses. For example, the address space in memory plane 991 spans a larger range of addresses than the address space in memory planes 990, 992, and 993. Another advantage of using the look-up table 962 is that chip selects for addresses within the address space of the memory planes can be easily generated based on the address received by the look-up table 962. Furthermore, as depicted in FIGS. 9D through 9G, some addresses within the address range for a memory plane are not used. The decode logic 960 and/or the look-up table 962 can be configured to disable bank selects for the not used addresses so that data operations to the memory planes within that address range are not allowed. If a designer wishes to add the capability of making one or more of the memory planes read only or write protected, additional address bit(s) can be used. By assigning bit(s) to act as a write protect for a given address area, writes to a protected address space can be blocked and writes to a read-only address space will not be allowed.

Figure 10A:
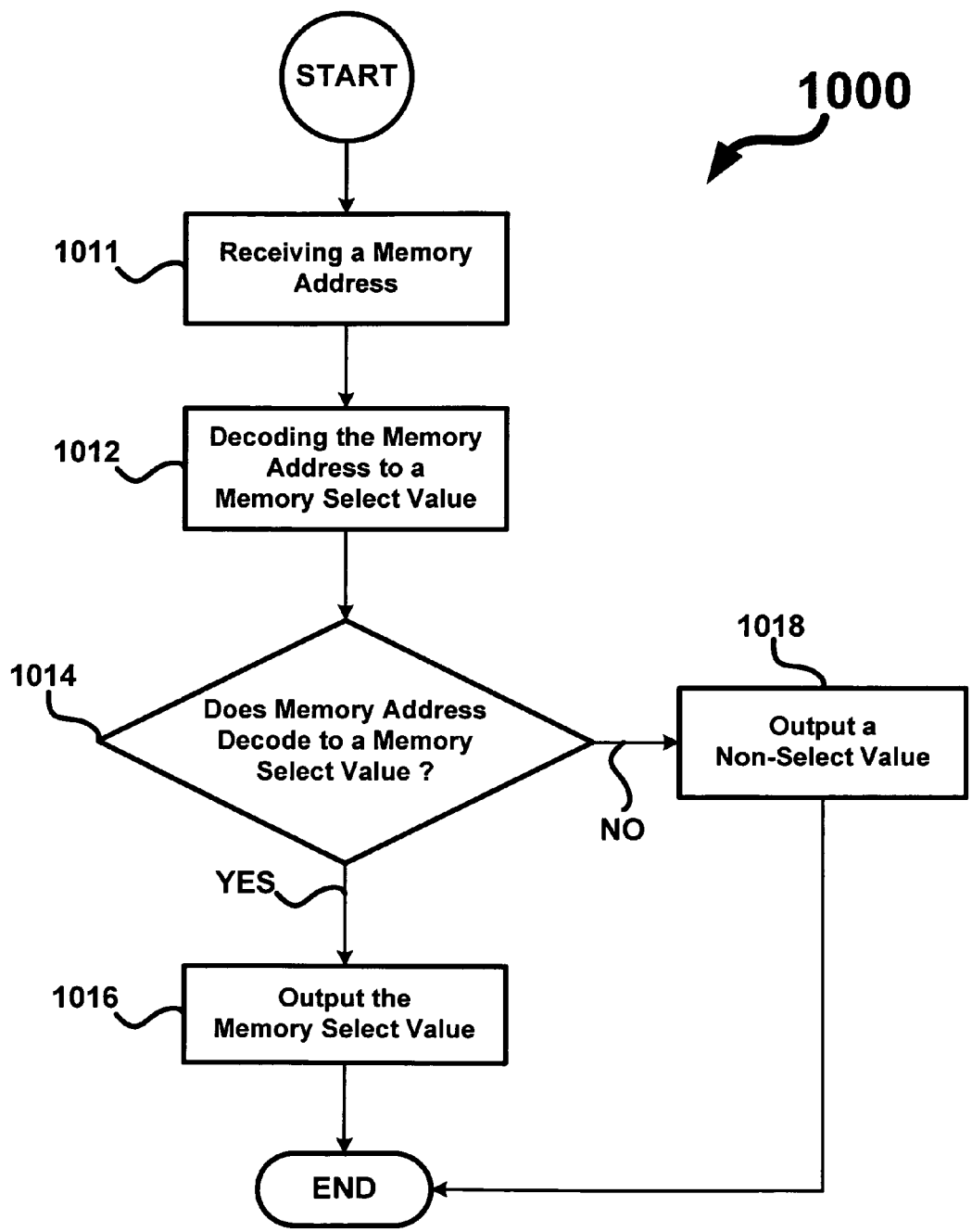
FIG. 10A depicts a flowchart diagram of a high level overview of an exemplary method for decoding a memory address.

FIG. 10A depicts an exemplary method 1000 for decoding a memory address. In general, FIG. 10A shows the sequence that would occur in a memory decode process. At a stage 1011, a memory address is received at a multiple-type memory. Thereafter, at a stage 1012, the memory address is decoded to a memory select value based on memory select parameters. The memory select parameters are preloaded and essentially specify the memory select value. The decode logic can recognize the predetermined memory select value (as specified by the memory select parameters) from the memory address. At a stage 1014, if the memory address decodes to the memory select value, then the "YES" branch is taken and the memory select value is outputted at a stage 1016, where the memory select value is configured to indicate a specific multiple-type memory. On the other hand, if the memory address decodes to a value that is different from the memory select value, then the "NO" branch is taken and a non-select value is outputted at a stage 1018. It should be appreciated that stages 1011-1018 can be executed within the memory.

Figure 10B:
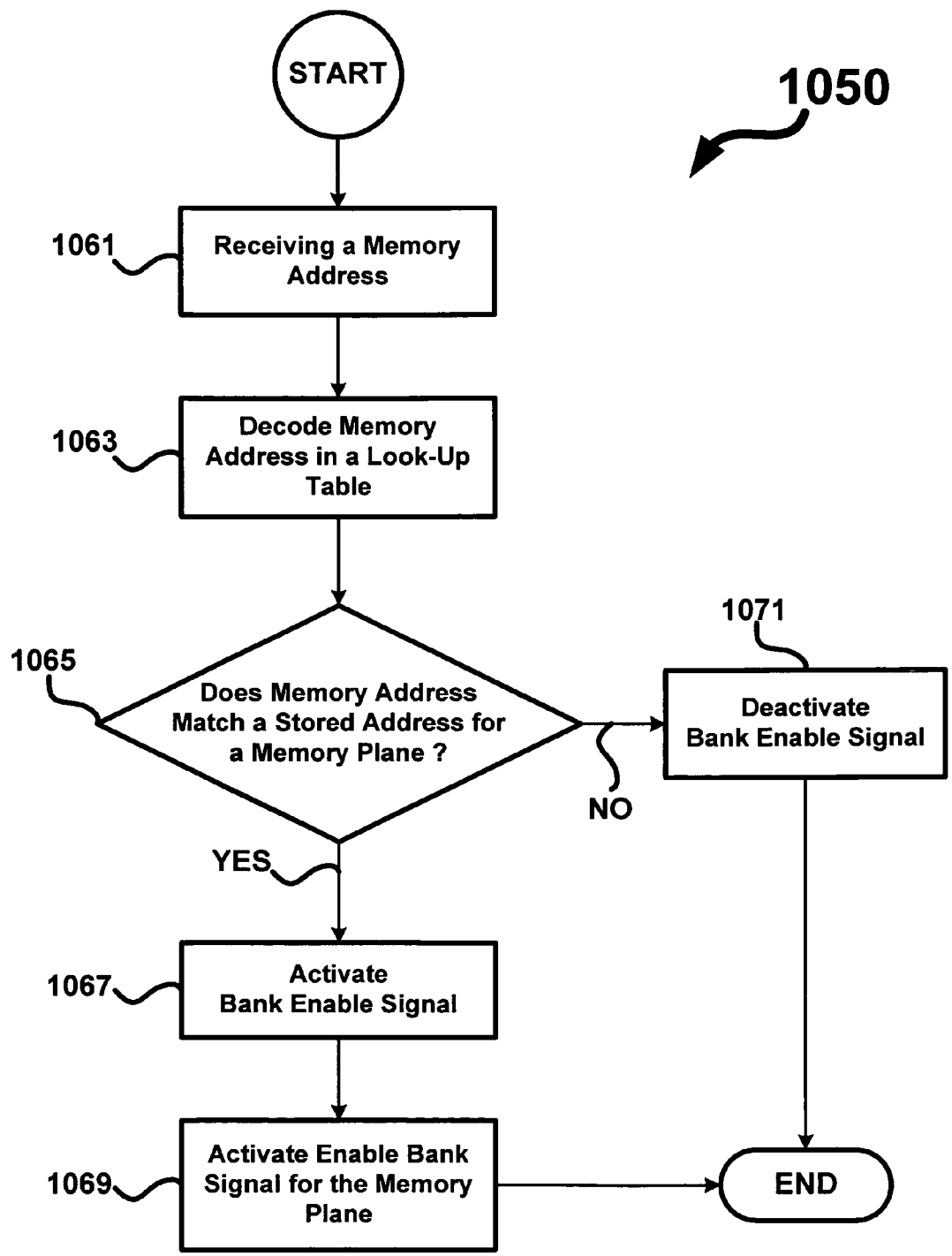
FIG. 10B depicts a flow diagram of a high level overview of art exemplary method for decoding memory addresses using a look-up table.

Turning now to FIG. 10B, an exemplary method 1050 for decoding a memory address for one or more memory planes using a look-up table is depicted. At a stage 1061 a memory address is received at a multiple-type memory that includes at least one memory plane. As was described above, at least a portion of the address bits in the memory address are received by a look-up table (e.g., look-up table 962). At a stage 1063 the address is decoded by the look-up table. At a stage 1065, the look-up table determines if the address matches an address stored in the look-up table. If the address matches the stored address, then a YES branch is executed and at a stage 1067 a bank enable signal (e.g., Bank_En 975) is activated to allow data operations to the memory plane corresponding to the stored address. At a stage 1069, an enable bank signal for the memory plane selected by the stored address is activated. The stages 1067 and 1069 can occur sequentially as depicted, can be combined into a single stage so that they occur substantially simultaneously, or both stages can occur in parallel. As was described above, the enable bank signal (e.g., En_Bank-0) can be coupled with an address decoder (e.g., 966) operative to activate a bank select signal (e.g., Sel-0) corresponding to the selected memory plane (e.g., Memory Plane 990) for a data operation to that memory plane. On the other hand, if the address does not match the stored address, then a NO branch is executed at a stage 1071 and the bank enable signal (e.g., Bank_En 975) is deactivated. The deactivated state can be the default state outputted by the look-up table such that the signal only goes active (e.g., logic 1) when a valid address matching a stored address is received by the look-up table. The method 1050 can include a stage prior to the stage 1061 in which write data is used to initialize the address ranges for the memory planes in the look-up table. If the address ranges for memory planes change dynamically or otherwise, the method 1050 can include a stage where new write data is used to re-initialize the address ranges for the memory planes in the look-up table. For example, a system incorporating one or more multiple-type memories may be configured to perform different functions, with each function requiring different configurations for the address ranges for the memory planes in the one or more multiple-type memories.

FIG. 11 is a schematic diagram of an exemplary circuit for outputting the memory select parameters. To minimize or eliminate the access time required when a memory is selected, the memory select parameters can be outputted in a steady state. For example, as shown in FIG. 11, circuitry 1101 for outputting the memory select parameters includes reset circuit 1106, sequencer 1102 (e.g., a counter), configuration memory 1104, and register banks 1108. During a power on, reset circuit 1106 receives power signal 1120 and outputs a power reset signal 1121 that activates sequencer 1102. As a result, sequencer 1102 generates an address 1123 that is communicated to the configuration memory 1104 and generates strobes 1127 that are communicated to the register banks 1108. The address 1123 results in the configuration memory 1104 outputting memory select parameter bits 1129 that are sequentially loaded into register banks 1108 by the strobes signal 1127. Register banks 1108 would hold the bits of the memory select parameters as long as the power signal 1120 is provided, therefore allowing the bits to remain active.

It should be appreciated that the exemplary decode logic of FIG. 9A, the exemplary decode logic using a look-up table of FIG. 9B, the exemplary circuitry 1101 of FIG. 11, and associated functions can be located within the logic plane of the multiple-type memory. In particular, at least a portion of one or more control logic blocks can be partitioned to include the decode logic and associated functions, or a dedicated control logic block can be assigned to perform the decode logic and associated functions. For example, as depicted in FIG. 4, the control logic block 420 for memory block 405 can include the exemplary decode logic of FIG. 9A, exemplary circuitry 1101 of FIG. 11, and associated functions. Memory block 405 and control logic block 420 of FIG. 4 can be hidden and programmed or altered through special write sequences when attached to a circuit. Preferably, the decode logic 814 of FIG. 9A, the decode logic 960 of FIG. 9B, the circuitry 1101 of FIG. 11, and associated functions are located in the logic plane. Placing the active circuitry in the logic plane instead of the memory plane(s) allows for fabricating the circuitry along with other circuits in the substrate the logic plane is fabricated in. Furthermore, the area available for memory is not reduced by having to allocate some of that area for the active circuitry, thereby maximizing memory density in the memory plane(s). In some embodiments, the look-up table and its associated circuitry are located in the logic plane. In other embodiments, the look-up table(s) is positioned in one or more of the memory planes and the circuitry for the look-up table(s) is positioned in the logic plane. As another example, in FIG. 9B the look-up table 962 can be positioned in the memory plane; whereas, the circuitry associated with the look-up table 962 as well as other circuitry for decode logic 960 can be positioned in the logic plane (e.g., circuitry associated with 964, 966, 968, and 970, etc.).

Figure 12:
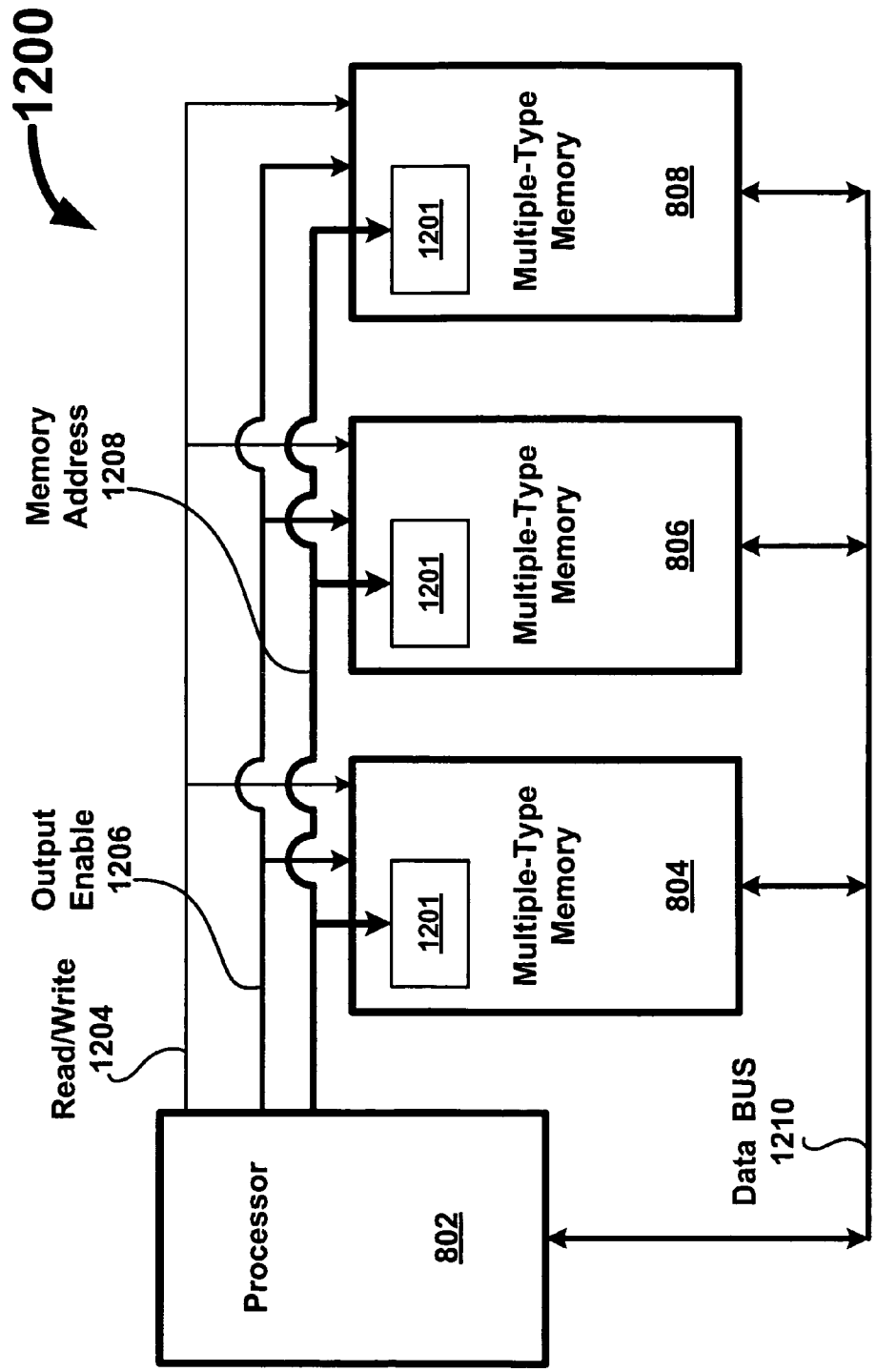
FIG. 12 depicts a block diagram of an exemplary system for activating a multiple-type memory.

FIG. 12 is a block diagram of an exemplary system for activating a multiple-type memory. With multiple-type memories 804, 806, and 808 that share a common data bus 1210, one of the multiple-type memories that recognizes the memory select value from memory address 1208 is activated. For example, as shown in FIG. 12, system 1200 includes processor 802 in communication with multiple-type memories 804, 806, and 808 through a common data bus 1210. Processor 802 outputs memory address 1208 for access (i.e., read from or write to) along with read/write signal 1204 and output enable signal 1206. Multiple-type memories 804, 806, and 808 receive the same signals (e.g., read/write signal 1204, output enable signal 1206, and memory address 1208, etc.) from processor 802. To prevent multiple-type memories 804, 806, and 808 from responding to the same signals at the same time, the multiple-type memories 804, 806, and 808 include activation logic 1201 that is configured to activate one of the multiple-type memories to drive the data bus 1210. In one embodiment, as will be explained in more detail below, activation logic 1201 may be particularly configured to qualify output enable signal 1206 based on the memory select value, where the output enable signal 1206 drives the data bus 1210.

Figure 13:
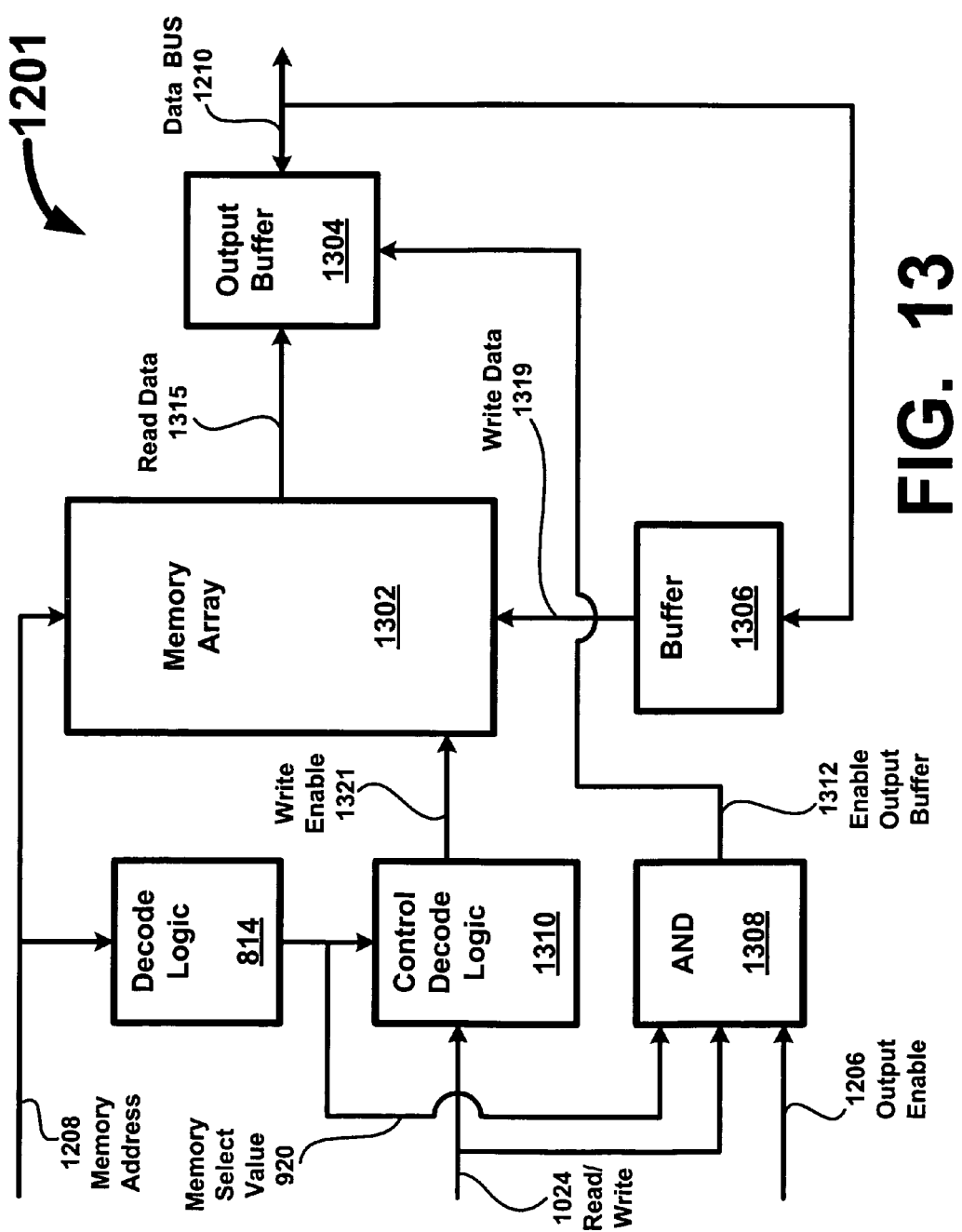
FIG. 13 depicts a schematic diagram of exemplary activation logic.

FIG. 13 is a schematic diagram of an exemplary activation logic. As shown in FIG. 13, activation logic 1201 includes memory array 1302, decode logic 814, control decode logic 1310, AND gate 1308, buffer 1306, and output buffer 1304. As discussed above, decode logic 814 receives memory address 1208 and decodes the memory address 1208 to memory select value 920. Memory select value 920, read/write signal 1204, and output enable signal 1206 are inputted into AND gate 1308. Essentially, to prevent multiple memories (e.g., 804, 806, and 808 in FIG. 12) from responding to the same signals at the same time, the multiple-type memory that decodes to the memory select value 920 (i.e., recognizes the memory select value 920) is activated by enabling output buffer 1304.

In the embodiment of FIG. 13, memory select value 920 is gated with read/write signal 1204 and output enable signal 1206 through AND gate 1308 to produce enable output buffer signal 1312. The AND gate 1308 outputs enable output buffer signal 1312 if memory select value 920, read/write signal 1204, and output enable signal 1206 are active. On the other hand, if any of memory select value 920, read/write signal 1204, or output enable signal 1206 is inactive, then AND gate 1308 will not generate enable output buffer signal 1312. Enable output buffer signal 1312 serves as a gating function for output buffer 1304 and therefore, the enable output buffer signal 1312 is configured to activate the output buffer 1304. Thus, when activation logic 1201 receives read/write signal 1204 and output enable signal 1206 from a processor, the activation logic 1201 activates output buffer 1304 if decode logic 814 decodes to memory select value 920. Activation logic 1201 therefore is configured to qualify output enable signal 1206, which drives the data bus 1210, based on memory select value 920. As a result, although multiple memories (e.g., 804, 806, and 808 in FIG. 12) receive the same signals (e.g., read/write signal 1204, output enable signal 1206, and memory address 1208, etc.) from the processor 802, the multiple-type memory that decodes to memory select value 920 responds to the memory access request from the processor 802.

In summary, the above-described embodiments provide decoders and look-up tables to select a memory. By including the decode logic or look-up table in the memory, an external programmable logic device or an external programmable array logic can be eliminated, thereby simplifying logics associated with memory selection.

Although the foregoing embodiments have been described in some detail for purposes of clarity of understanding, implementations of the above-described system and techniques is not limited to the details provided. There are many alternative implementations and the disclosed embodiments are illustrative and not restrictive.

What is claimed is:

1. A method of decoding a memory address in non-Flash re-writeable non-volatile comprising:
receiving a memo address for one or more multi-type memories;
decoding the memo address using redetermined memo select parameters operative to determine if the decoded memory address indicates that a specific multiple-type memory is among the one or more multi-type memories;
outputting a memory select value for the specific multiple-type memory when the decoded memory address indicates that the specific multiple-type memory is among the one or more multiple-type memories; and
outputting a non-select value when the decoded memory address indicates that the specific multiple-type memory is not among the one or more multiple-type memories,
wherein each multiple-type memory includes at least one memory plane in contact with and fabricated directly above a silicon substrate that includes a logic plane having control logic block circuitry and decode logic circuitry fabricated in the logic plane, each memory plane including at least one memory block electrically coupled with the control logic block circuitry, and
wherein the decode logic circuitry is configured to decode the memory address and to output the memory select value or the non-select value.

2. A method of decoding a memory address in non-Flash re-writeable non-volatile vertically stacked memory, comprising:
receiving a memory address for one or more multiple-type memories;
decoding the memory address using predetermined memory select parameters operative to determine if the decoded memo address indicates that a specific multiple-type memory is among the one or more multiple-type memories;
outputting a memory select value for the specific multiple-type memory when the decoded memo address indicates that the specific multiple-type memory is among the one or more multiple-type memories; and
outputting a non-select value when the decoded memory address indicates that the specific multiple-type memory is not among the one or more multiple-type memories,
wherein each multiple-type memory includes at least one memory plane in contact with and fabricated directly above a silicon substrate that includes a logic plane having control logic block circuitry and decode logic circuitry fabricated in the logic plane, each memory plane including at least one memory block electrically coupled with the control logic block circuitry,
wherein the decode logic circuit is configured to decode the memo address and to output the memory select value or the non-select value, and
wherein each memory block includes at least one two-terminal cross-point memory array embedded in the memory block, each memory array including a plurality of first conductive array lines and a plurality of second conductive array lines that are electrically coupled with the control logic block circuitry.

3. A method of decoding a memory address in non-Flash re-writeable non-volatile vertically stacked memory, comprising:
receiving a memory address for one or more multiple-type memories;
decoding the memory address using predetermined memory select parameters operative to determine if the decoded memory address indicates that a specific multiple-type memory is among the one or more multiple-type memories;
outputting a memory select value for the specific multiple-type memory when the decoded memo address indicates that the specific multiple-type memory is among the one or multiple-type memories;
outputting a non-select value when the decoded memory address indicate that the specific multiple type memory not among the one or more multiple-type memories,
wherein each multiple-type memory includes at least one memory plane in contact with and fabricated directly above a silicon substrate that includes a logic plane having control logic block circuitry and decode logic circuitry fabricated in the logic plane, each memory plane including at least one memory block electrically coupled with the control logic block circuitry,
wherein the decode logic circuitry is configured to decode the memory address and to output the memory select value or the non-select value, and
wherein each memory block includes at least one two-terminal cross-point memory array embedded in the memory block, each memory array including a plurality of first conductive array lines and a plurality of second conductive array lines that are electrically coupled with the control logic block circuitry; and
a plurality of re-writeable non-volatile two-terminal memory elements having a first terminal and a second terminal, each memory element is positioned between a cross-point of one of the plurality of first conductive array lines with one of the plurality of second conductive array lines and has its first terminal electrically coupled with its respective first conductive array line and its second terminal electrically coupled with its respective second conductive array line, and wherein each memory element is directly electrically in series with its respective first and second conductive array lines.

4. A method of decoding a memory address in non-Flash re-writeable non-volatile vertically stacked memory, comprising:
receiving a memory address for one or more multiple-type memories;
decoding the memory address using predetermined memory select parameters operative to determine if the decoded memory address indicates that a specific multiple-type memory is among the one or more multiple-type memories;
outputting a memory select value for the specific multiple-type memory when the decoded memory indicates that the specific multiple-type memory is among the one or more multiple-type memories;
outputting a non-select value when the decoded memo address indicates that the specific multiple-type memory is not among the one or more multiple-type memories,
wherein each multiple-type memory includes at least one memory plane in contact with and fabricated directly above a silicon substrate that includes a logic plane having control logic block circuitry and decode logic circuitry fabricated in the logic plane, each memory plane including at least one memory block electrically coupled with the control logic block circuitry,
wherein the decode logic circuitry is configured to decode the memory address and to output the memory select value or the non-select value, and
wherein each memory block includes at least one two-terminal cross-point memory array embedded in the memory block, each memory array including a plurality of first conductive array lines and a plurality of second conductive array lines that are electrically coupled with the control logic block circuitry; and
a plurality of re-writeable non-volatile two-terminal memo elements having a first terminal and a second terminal, each memory element is positioned between a cross-point of one of the plurality of first conductive array lines with one of the plurality of second conductive array lines and has its first terminal electrically coupled with its respective first conductive array line and its second terminal electrically coupled with its respective second conductive array line and wherein each memory element is directly electrically in series with its respective first and second conductive array lines,
wherein each memory element includes a mixed ionic electronic conductor including mobile oxygen ions and an electrolytic tunnel barrier having a thickness that is less than 50 Angstroms, the electrolytic tunnel barrier in direct contact with the mixed ionic electronic conductor.

5. A method of decoding a memory address in non-Flash re-writeable non-volatile vertically stacked memory, comprising:
receiving a memory address for one or more multiple-type memories;
decoding the memory address using predetermined memory select parameters operative to determine if the decoded memory address indicates that a specific multiple-type memory is among the one or more multiple-type memories;
outputting a memory select value for the specific multiple-type memory when the decoded memo address indicates that the specific multiple-type memory is among the one or more multiple-type memories;
outputting a non-select value when the decoded memory address indicates that the specific multiple-type memory is not among the one or more multiple-type memories,
wherein each multiple type memory includes at least one memory plane in contact with and fabricated directly above a silicon substrate that includes a logic plane having control logic block circuitry and decode logic circuitry fabricated in the logic plane, each memory plane including at least one memory block electrically coupled with the control logic block circuitry, and
wherein the decode logic circuitry is configured to decode the memory address and to output the memory select value or the non-select value;
a plurality of memory blocks; and
a plurality of control logic blocks that are included in the control logic block circuitry, each memory block is electrically coupled with only one of the plurality of control logic blocks.

6. A method of decoding a memory address in non-Flash re-writeable non-volatile vertically stacked memory, comprising:
receiving a memory address for one or more multiple-type memories;

decoding the memory address using predetermined memory select parameters operative to determine if the decoded memory address indicates that a specific multiple type memory is among the one or more multiple-type memories;

outputting a memo select value for the specific multiple-type memory when the decoded memory address indicates that the specific multiple-type memory is among the one or more multiple-type memories;

outputting a non-select value when the decoded memo address indicates that the specific multiple-type memory is not among the one or more multiple-type memories, wherein each multiple-type memory includes at least one memory plane in contact with and fabricated directly above a silicon substrate that includes a logic plane having control logic block circuitry and decode logic circuitry fabricated in the logic plane, each memory plane including at least one memory block electrically coupled with the control logic block circuitry, and wherein the decode logic circuitry is configured to decode the memory address and to output the memory select value or the non-select value;

a plurality of memo blocks;

a plurality of control logic blocks that are included in the control logic block circuitry, each memory block is electrically coupled with only one of the plurality of control logic blocks; and a plurality of memory planes in contact with one another and vertically stacked above the silicon substrate, wherein the plurality of memory blocks are distributed among the plurality of memory planes.

7. A method of decoding a memory address in non-Flash re-writeable non-volatile vertically stacked memory, comprising:

receiving a memory address for one or more multiple-type memories;

decoding the memory address using predetermined memory select parameters operative to determine if the decoded memory address indicates that a specific multiple-type memory is among the one or more multiple-type memories;

outputting a memory select value for the specific multiple-type memory when the decoded memo address indicates that the specific multiple-memory is among the one or more multiple-type memories;

outputting a non-select value when the decoded memo address indicates that the specific multiple-type memory is not among the one or more multiple-type memories, wherein each multiple-type memory includes at least one memory plane in contact with and fabricated directly above a silicon substrate that includes a logic plane having control logic block circuitry and decode logic circuitry fabricated in the logic plane, each memory plane including at least one memory block electrically coupled with the control logic block circuitry, and wherein the decode logic circuitry is configured to decode the memory address and to output the memory select value or the non-select value;

a plurality of memory blocks; and a plurality of control logic blocks that are included in the control logic block circuit, each memory block is electrically coupled with only one of the plurality of control logic blocks, wherein at least one of the plurality of memory planes includes more than one of the plurality of memory blocks.

8. A method of decoding a memory address in non-Flash re-writeable non-volatile vertically stacked memory, comprising:

receiving a memory address for one or more multiple-type memories;

decoding the memory address using redetermined memo select parameters operative to determine if the decoded memory address indicates that a specific multiple-type is among one or more multiple-type memories;

outputting a memory select value for the specific multiple-type memory when the decoded memory address indicates that the specific multiple-type memory is among the one or more multiple-type memories;

outputting a non-select value when the decoded memory address indicates that the specific multiple type memory is not among the one or more multiple-type memories, wherein each multiple-type memory includes at least one memory plane in contact with and fabricated directly above a silicon substrate that includes a logic plane having control logic block circuitry and decode logic circuitry fabricated in the logic plane, each memory plane including at least one memory block electrically coupled with the control logic block circuitry, and wherein the decode logic circuitry is configured to decode the memory address and to output the memory select value or the non-select value;

a plurality of memory blocks; and a plurality of control logic blocks that are included in the control logic block circuitry, each memory block is electrically coupled with only one of the plurality of control logic blocks, wherein the predetermined memory select parameters are stored in one or more of the plurality of memory blocks.

9. A method of decoding a memory address in non-Flash re-writeable non-volatile vertically stacked memory, comprising:

receiving a memory address for one or more multiple-type memories, decoding at least a portion of the memory address using a look-up table to determine if the portion matches an address stored in the look-up table, the address indicating that a specific multiple-type memory is included in the one or more multiple-type memories;

activating a bank enable signal if the portion matches the address, the bank enable signal operative to allow data operations on a memory plane in the specific multiple-type memory, the memory plane specified by the address;

activating, based on the activation of the bank enable signal, an enable bank signal for the memory plane selected by the address; and de-activating the bank enable signal if the portion does not match the address.

10. The method of claim 9, wherein the memory address includes data indicative of an address for a first multiple-type memory, a first memory plane disposed in the first multiple-type memory, and a first memory block disposed in the first memory plane.

11. The method of claim 10, wherein the memory address includes data indicative of a first two-terminal cross-point memory array disposed in the first memory block and data indicative of at least one two-terminal memory element disposed in the first two-terminal cross-point memory array.

12. The method of claim 9, wherein the look-up table is disposed in a specific memory plane disposed in the one or more multiple-type memories.

13. The method of claim 9, wherein activation of the bank enable signal and the enable bank signal occurs a selected one of substantially simultaneously or in parallel.

14. The method of claim 9, wherein write data is used to initialize address ranges for memory planes stored in the look-up table.

15. The method of claim 9, wherein each multiple-type memory includes at least one memory plane in contact with and fabricated directly above a silicon substrate that includes a logic plane having control logic block circuitry and decode logic circuitry fabricated in the logic plane, each memory plane including at least one memory block electrically coupled with the control logic block circuitry, and wherein the decode logic circuitry is electrically coupled with the look-up table.

16. The method of claim 15, wherein each memory block includes at least one two-terminal cross-point memory array embedded in the memory block, each memory array including a plurality of first conductive array lines and a plurality of second conductive array lines that are electrically coupled with the control logic block circuitry.

17. The method of claim 16 and further comprising:
a plurality of re-writeable non-volatile two-terminal memory elements having a first terminal and a second terminal, each memory element is positioned between a cross-point of one of the plurality of first conductive array lines with one of the plurality of second conductive array lines and has its first terminal electrically coupled with its respective first conductive array line and its second terminal electrically coupled with its respective second conductive array line, and wherein each memory element is directly electrically in series with its respective first and second conductive array lines.

* * * * *